(12) United States Patent
Jeffries

(10) Patent No.: US 9,805,310 B2
(45) Date of Patent: Oct. 31, 2017

(54) UTILIZING SPATIAL STATISTICAL MODELS TO REDUCE DATA REDUNDANCY AND ENTROPY

(71) Applicant: Adam Jeffries, Torrance, CA (US)

(72) Inventor: Adam Jeffries, Torrance, CA (US)

( * ) Notice: Subject to any disclaimer, the term of this patent is extended or adjusted under 35 U.S.C. 154(b) by 577 days.

(21) Appl. No.: 14/381,940

(22) PCT Filed: Mar. 4, 2013

(86) PCT No.: PCT/IB2013/051700
§ 371 (c)(1),
(2) Date: Aug. 28, 2014

(87) PCT Pub. No.: WO2013/132408
PCT Pub. Date: Sep. 12, 2013

(65) Prior Publication Data
US 2015/0066834 A1    Mar. 5, 2015

Related U.S. Application Data

(60) Provisional application No. 61/606,446, filed on Mar. 4, 2012.

(51) Int. Cl.
G06N 7/00      (2006.01)
H04N 19/463    (2014.01)
H04N 19/91     (2014.01)
G06F 17/30     (2006.01)
H03M 7/30      (2006.01)

(52) U.S. Cl.
CPC ....... *G06N 7/005* (2013.01); *G06F 17/30595* (2013.01); *H03M 7/3068* (2013.01); *H03M 7/3079* (2013.01); *H04N 19/463* (2014.11); *H04N 19/91* (2014.11)

(58) Field of Classification Search
None
See application file for complete search history.

(56) References Cited

U.S. PATENT DOCUMENTS

| | | | |
|---|---|---|---|
| 6,411,228 B1 | 6/2002 | Malik | |
| 6,956,973 B1 * | 10/2005 | Liang | H04N 19/647 375/E7.047 |
| 7,990,289 B2 | 8/2011 | Monro | |
| 8,279,227 B2 | 10/2012 | Cohen | |
| 2008/0031344 A1 * | 2/2008 | Lu | H04N 19/647 375/240.19 |

(Continued)

OTHER PUBLICATIONS

Buccigrossi et al. Image Compression via Joint Statistical Characterization in the Wavelet Domain. IEEE Transactions on Image Processing, vol. 8, No. 12, Dec. 1999.*

(Continued)

*Primary Examiner* — Lut Wong
*Assistant Examiner* — Robert Bejcek, II
(74) *Attorney, Agent, or Firm* — Knobbe, Martens, Olson & Bear LLP

(57) ABSTRACT

A method, article comprising machine-readable instructions and apparatus that processes data systems for encoding, decoding, pattern recognition/matching and data generation is disclosed. State subsets of a data system are identified for the efficient processing of data based, at least in part, on the data system's systemic characteristics.

30 Claims, 16 Drawing Sheets

(56) References Cited

U.S. PATENT DOCUMENTS

| | | | | |
|---|---|---|---|---|
| 2012/0140829 A1* | 6/2012 | Rane | | H04N 19/50 375/240.18 |
| 2013/0223528 A1* | 8/2013 | Lim | | H04N 19/91 375/240.12 |
| 2014/0040215 A1* | 2/2014 | Cai | | G06T 17/005 707/693 |
| 2014/0105293 A1* | 4/2014 | George | | H04N 19/436 375/240.12 |

OTHER PUBLICATIONS

Coifman et al. Entropy-Based Algorithms for Best Basis Selection. IEEE Transactions on Information Theory. vol. 38, No. 2, Mar. 1992.*

Shapiro, Jerome. Embedded Image Coding Using Zerotrees of Wavelet Coefficients. IEEE Transactions on Signal Processing vol. 41 No. 12 Dec. 1993.*

Lin et al. SPEC Hashing: Similarity Preserving algorithm for Entropy-based Coding. IEEE Conference on Computer Vision and Pattern Recognition (CVPR), 2010.*

Barbara et al. COOLCAT: An entropy-based algorithm for categorical clustering. CIKM '02, Nov. 4-9, 2002, McLean, VA, USA.*

Arithmetic Coding, Wikipedia, 6 pages, downloaded Dec. 10, 2015 https://en.wikipedia.org/w/index.php?title=Arithmetic_coding&oldid=474586903, dated Feb. 2, 2012.

Phase Space, Wikipedia, 5 pages, downloaded Dec. 10, 2015 https://en.wikipedia.org/w/index.php?title=Phase_space&oldid=526880637, dated Dec. 2012.

State Space, Wikipedia, 2 pages, downloaded Dec. 10, 2015 https://en.wikipedia.org/w/index.php?title=State_space&oldid=497783348, dated Jun. 15, 2012.

Anonymous, "Data compression," Wikipedia, the free encyclopedia, dated Mar. 1, 2012, 8 pages, retrieved from the internet on Oct. 23, 2015 URL:http://web.archive.org/web/20120301082842/https://en.wikipedia.org/wiki/Data_compression.

Bucilă et al., "Model compression," Proceedings of the 12$^{th}$ ACM SIGKDD International Conference on Knowledge Discovery and Data Mining, Aug. 20-23, 2006, Philadelphia, PA, USA, Jan. 1, 2006, p. 535.

Extended EP Search Report regarding Application No. 13757176.6-1905 / 2823409 PCT/IB2013051700, 9 pages, dated Oct. 30, 2015.

Fortnow, Lance, "Kolmogorov complexity" in "Aspects of Complexity," DeGruyter, Berlin, New York, 14 pages, dated Jan. 31, 2001.

Merkhofer, Miley W., "Quantifying judgmental uncertainty: Methodology, experiences, and insights", IEEE Transactions on Systems, Man and Cybernetics, vol. 17, No. 5, dated Sep. 1, 1987, 12 pages.

Nelson, Roger, "Pseudorandom Data and Clone analyses," 2 pages, dated Jan. 18, 2012, retrieved from the internet Oct. 23, 2015 URL:http://web.archive.org/web/20120118050552/http://noosphere.princeton.edu/pseudoeggs.html.

Reeves et al., "Managing massive time series streams with multi-scale compressed trickles," Proceedings of the VLDB Endowment, vol. 2, No. 1, dated Aug. 1, 2009, pp. 97-108.

Chaos Theory, Wikipedia, printed on Apr. 25, 2016 (9 pages).

International Search Report in International Application No. PCT/IB2013/051700, dated Jul. 31, 2013.

Hart, Peter E. et al., "A Formal Basis for the Heuristic Determination of Minimum Cost Paths," IEEE Transactions of Systems Science and Cybernetics, vol. SSC-4, No. 2, Jul. 1968, pp. 100-107.

Ming Fang et al., "Maintaining Integrity Constraints among Distributed Ontologies," In Conference on Complex, Intelligent and Software Intensive Systems, Jun. 30, 2011, pp. 184-191.

Nayda G. Santiago et al., "A Statistical Approach for the Analysis of the Relation Between Low-Level Performance Information, the Code, and the Environment," Proceedings of International Conference on Parallel Processing Workshops, 2002, pp. 282-289.

Razvan Cristescu, "On Node Selection for Classification in Correlated Data Sets," In: Conference on Information Sciences and Systems, Mar. 19, 2008, pp. 1064-1068.

Sivaramakrishnan Narayanan et al., "On Creating Efficient Object-relational Views of Scientific Datasets," Proceedings of the 2006 International Conference on Parallel Processing, Aug. 14, 2006, pp. 551-558.

* cited by examiner

FIG.6
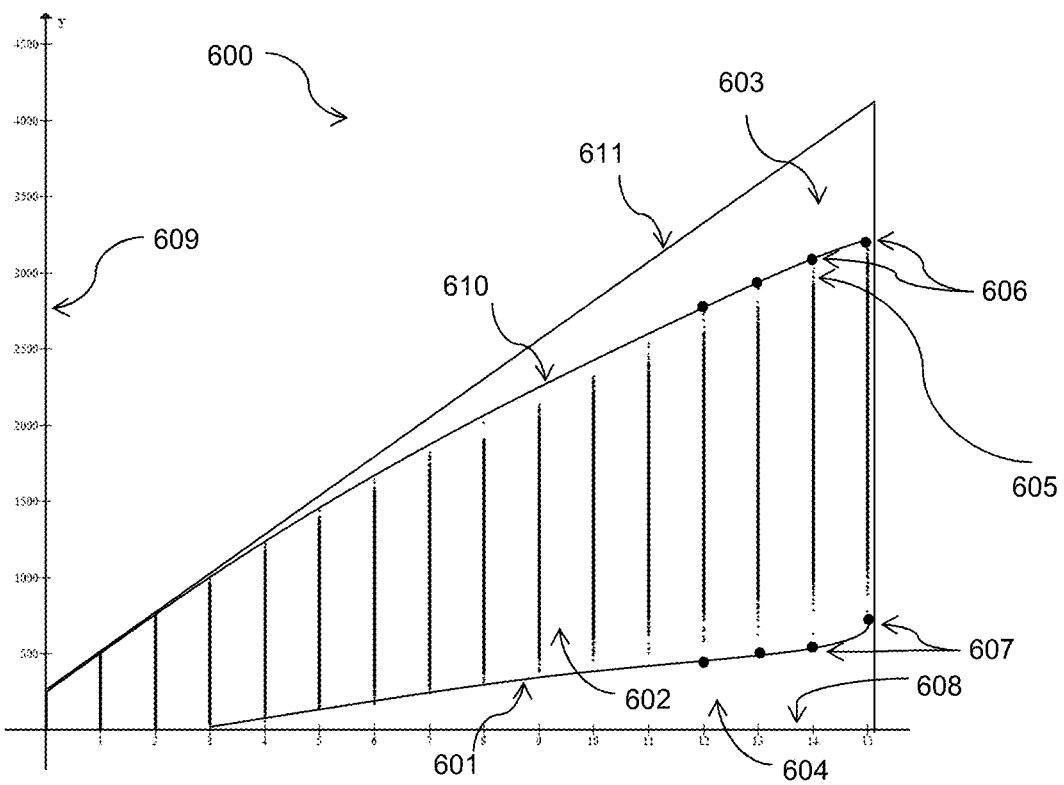
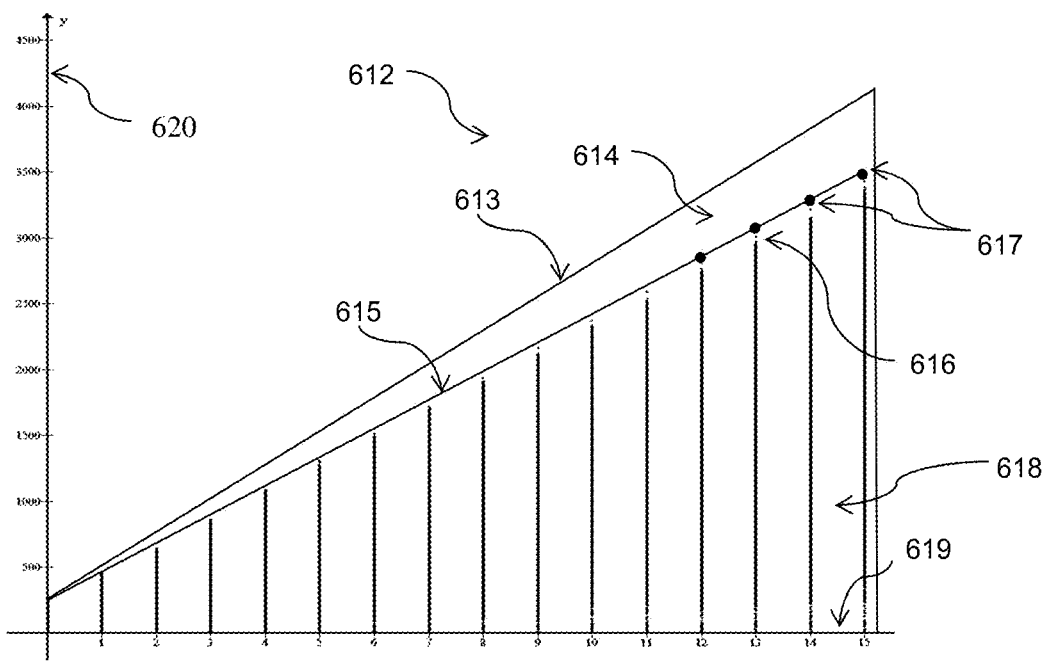

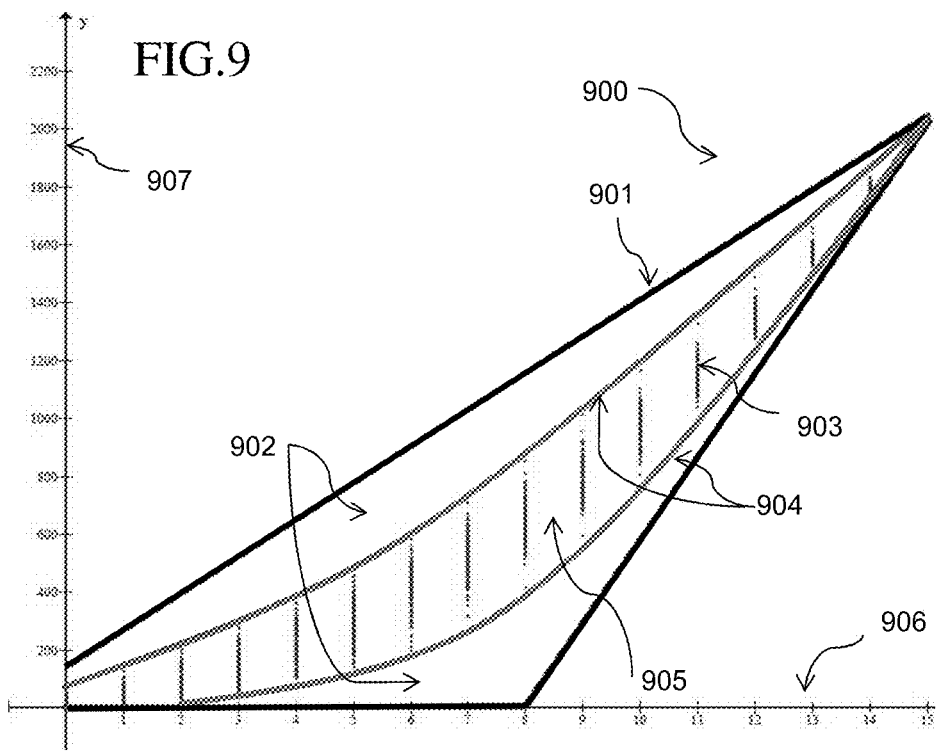
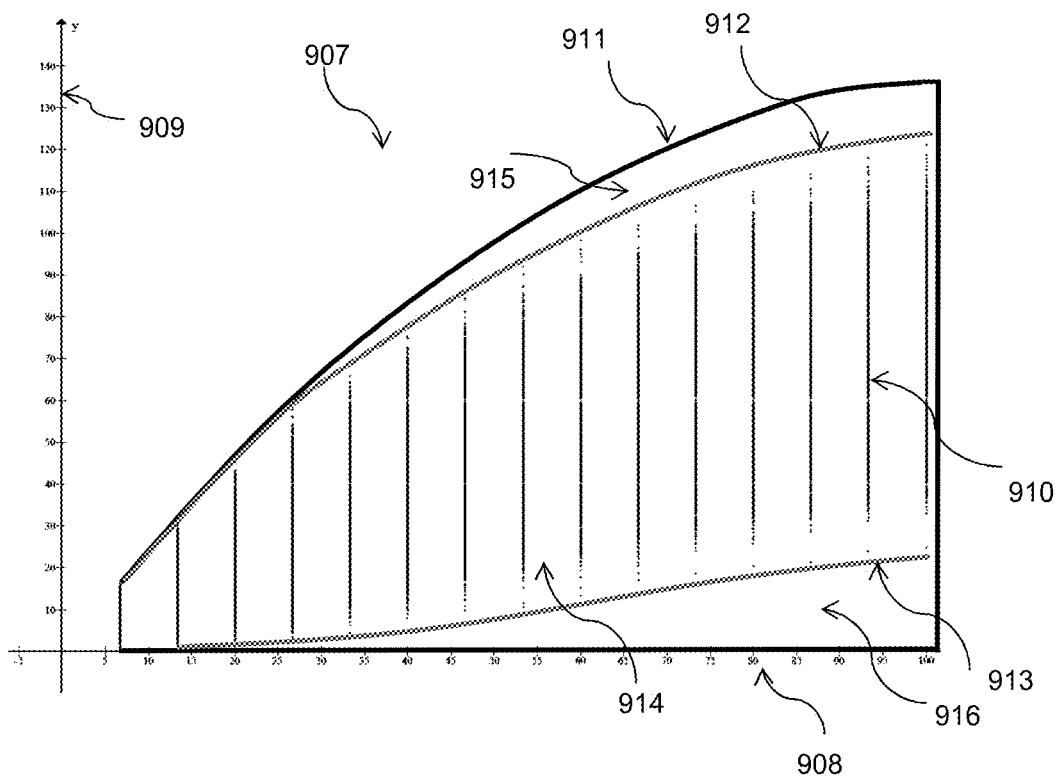
FIG.9

Ordered list of identifiers:

1100

1) Ordered list of identifiers further represents at least one of the following:
   1101 → a) A set of symbol criteria.
   1102 → b) An indicator that represents a type of state subset.
   1103 → c) A deformation value that indicates a difference between the argument value and a previous argument value
   1104 → d) A size of the data system.
   1105 → e) The tree data structure.

UTILIZING SPATIAL STATISTICAL MODELS TO REDUCE DATA REDUNDANCY AND ENTROPY

This application claims the benefit of priority to U.S. Provisional Patent Application Ser. No. 61/606,446 filed on Mar. 4, 2012. These and all other extrinsic materials discussed herein are incorporated by reference in their entirety. Where a definition or use of a term in an incorporated reference is inconsistent or contrary to the definition of that term provided herein, the definition of that term provided herein applies and the definition of that term in the reference does not apply.

FIELD OF THE INVENTION

The field of the inventive subject matter is data processing, which includes: statistical modeling, data encoding and decoding, data simulation and branches of artificial intelligence, such as pattern recognition.

BACKGROUND

Patterns of data are described using models, which allow data processing methods to remove information redundancy for lossless and lossy data compression, and reduce the number of calculations required for pattern recognition, data generation and data encryption. Four basic data modeling techniques exist in the known art, which are statistical modeling, dictionary coding, combinatorial coding and mathematical functions.

Statistical modeling determines a probability for a state or symbol based on a number of times the symbol occurs. The probabilities are recorded in an index, which can then be accessed by a decoder to decipher the message. An encoder can generate a more efficient code by implementing the model. It is why Morse code uses short codes for "A, E, I and U" and long codes for "X, Y, Z" or "0-9", for the vowels in the English alphabet are modeled with a higher probability than consonants and numbers.

Assigning probability values also enables a pattern recognition method to reduce a number of states to select from when matching or recognizing data. For voice or speech recognition, the Hidden Markov model is used, which can use an index to assign probabilities to the possible outcomes.

The second technique typically used for modeling data is the dictionary coder, which records patterns of strings by assigning a reference to the string's position. To eliminate redundancy, the number of references must be less than the number of possible patterns for a string, given its length. The references substitute for the strings to create an encoded message. To reconstruct the message, the decoder reads the reference, looks it up in the dictionary and writes the corresponding string.

The decoder must access the statistical index or dictionary to decode the message. To allow for this access, the index/dictionary can be appended to the encoded message. Appending the index or dictionary may not add much to the compressed code if a relatively short number of states are modeled. If the number of patterns in the index or dictionary is too large, then any advantage gained by compressing the data can be eliminated after the statistical index or dictionary is appended.

In the known art, an adaptive index or dictionary can be used to solve the problem of appending it to the encoded message. In adaptive modeling, both the encoder and the decoder use the same statistical model or dictionary at the start of the process. It then reads each new string and updates the model as the data is being encoded or decoded. This helps to improve compression ratios, for the model is not added with the message.

Two main problems exist when using an adaptive index and dictionary. The first is that it is relatively inefficient near the beginning of the data stream. This is due to the fact that the encoder starts with using a small number of patterns in the model. The smaller the number of patterns modeled, the less accurate the model is relative to the size of the message. Its efficiency may improve once the number of patterns increases as the adaptive model grows. A more significant problem is that, like the static index or dictionary, the adaptive model must be constructed and stored in memory. Modeling more patterns can deplete memory resources when the index or dictionary becomes too large. More calculations are also required to update the index/dictionary. The third problem is that adaptive modeling is more computationally expensive compared to static indexes or dictionaries because the model must be constantly updated as the decoder decodes the message. For example, using adaptive compression with Huffman tree codes requires the data processor to continuously update the nodes and branches of the code data tree as it encodes/decodes. For arithmetic coding, updating the probabilities for each symbol pattern requires updating the counts for all the subsequent symbol patterns as well. This can take a considerable amount of time for the processor to calculate the probabilities for a large index, for the number of possible patterns rises exponentially with each bit added. The adaptive technique can therefore slow productivity of a device requiring frequent encoding/decoding of data, such as medical data, audio, video or any other data that requires rapid access. This can be especially problematic for mobile devices, which typically hold less memory and processing power than personal computers and database machines.

The third modeling technique involves combinatorial encoding. As exemplified in U.S. Pat. No. 7,990,289 to Monro titled "Combinatorial Coding/Decoding for Electrical Computers and Digital Data Processing Systems" filed Jul. 12, 2007, combinatorial encoding counts a number of times a symbol appears in a sequence and generates a code describing its pattern of occurrences. This method can be effective for text documents where there is usually a statistical bias in the number of counts for each symbol or, when the numbers of occurrences are predetermined or known to the decoder. This statistical bias may be used in combinatorial coding to compress data.

A problem with this method is that the effectiveness may lessen if there is no statistical bias or, when the numbers of counts are relatively equal and unknown. When the counts for each symbol reach parity, the number of combinations is at its highest, resulting in very little compression. Also, the number of occurrences of each symbol needs to be, like an index/dictionary, accessible to the decoder in order to decode the encoded message describing the pattern of occurrences. Like the problem associated with appending dictionary encoders, any compression gained by encoding the pattern of occurrences can be nullified if an index describing the number of occurrences for each symbol is too large.

The fourth modeling technique involves signal processing, which includes the modeling of waveforms and time series data using mathematical functions. Such methods usually extract three basic patterns of the data; trends, cycles and white noise. Trends describe a gradual tendency for the signal to increase or decrease in time. Cycles describe repeating patterns in the data, such as frequencies. White noise is considered random-like data, which offers no discernible patterns. These three pattern types can be calculated within a time, frequency or time-frequency domain. Such pattern extraction techniques include autocorrelation, Fourier analysis and wavelets. By using mathematical functions to decipher patterns of a signal, the inverse of the functions can either approximate the signal or reconstruct it. These models can then be used for analyzing and forecasting stock prices and, for lossy data compression.

The problem associated with using mathematic functions as a model is that the functions tend to identify only general properties of the data. Reconstructing finer details of the signal is computationally expensive. Secondly, they offer no known way of generating a probability for a unique data sequence deterministically, for probabilities are not incorporated into the calculation. Probability values are required to measure the information entropy of a sequence. Therefore, these techniques are generally used for approximating signals using lossy data compression or forecasting; not for lossless data compression, particularly involving literal data such as text or machine code.

One may see that a fundamental problem for all of the four modeling techniques is that they are all memory and computationally expensive whenever their models describe the probabilities for large numbers of states, long sequences of data or, data with high entropy. Modeling a large number of states increases the model's efficiency, but it also takes a toll on the data processor and memory. For example, with pattern recognition, the Hidden Markov model, coupled with a dynamic programming technique, can be computationally intensive the more outcomes there are to solve for. The only way to reduce the computational complexity of pattern recognition and data compression using the modeling techniques in the known art is to reduce the number of patterns to model for.

Lossy encoders, however, attempt to encode the general meaning of a message similarly to signal analysis. For example, JPEG compression methods analyze the brightness and chrominance of each pixel and attempts to find statistical redundancy for those values. Because humans perceive more detail in the brightness of an image rather than in its hues, the chrominance can be down sampled, which eliminates some of the information by using a statistical model tailored to the way humans perceive light.

Lossy encoding generally achieves higher compression ratios than lossless methods because the finer details of the message are not as important as the message's broader values. The human visual perception is not based on a pixel by pixel scan of an image, but on a wide view of the image. This is also the case with sound and language. Humans can usually understand a sentence without requiring each letter or word to be accurate. Most people will be able to understand the following sentence in the English language, without all the letters or words being accurate: "I lov yu."

The problem with lossy compression is that it sacrifices information in order to encode or process the data. If too much information is sacrificed, the image, video or sound quality is degraded, which is undesirable for many applications, such as high definition video or audio. Even with lossy compression, the amount of data to store, process and transmit for video/audio files can reach into the trillions of bytes. Mathematical functions used in many lossy encoders/decoders require the use of graphic accelerators, faster data processors, larger amounts of memory and higher bandwidth, which is not always feasible, especially for mobile and embedded devices. Another problem with lossy compression is that it cannot be used for all types of data. Every byte of an executable must be precise and without loss, otherwise, the intended meaning, which are the machine instructions, cannot be accurately processed by the data processor.

There are a wide variety of techniques in the known art that use visual aids to identify data patterns. For example, a time series chart plots data values within a two dimensional graph, which enables human beings to see the structure of the time series over a period of time. The goal of the time series chart is to identify patterns in a visual way. Lines, curves and moving averages may be used to plot the data points in the time series within the graph. Models are then fitted to the data points to help determine various patterns.

A problem using charts to model patterns is that they only tend to use two or three dimensions, for they are used for the aid of a human being. They are typically not used for determining the probabilities of sequences and other characteristics in more abstract spaces, such as topological spaces, non-Euclidian spaces, or in spaces with four or more dimensions. Much of the data processing methods in the known art still process data as a sequence of variables, not as a shape.

Models are also used in computer simulation to generate data. It is not trivial for a data processing machine to simulate true randomness, though it can generate pseudo-randomness, which is a simulation of randomness using techniques such as a stochastic or Markov process. This is a problem for encryption, where random data is used to help encrypt a digital message for security purposes. To solve this problem of simulating random data by a data processor, known methods have used natural phenomena, such as weather storms or radioactive decay to assist with generating randomness. The problem with using natural phenomena to generate random data is that a data processing system is required to have additional machines that incorporate data from the natural phenomena, which may not always be available or practical.

One of the biggest problems in the known art regarding data processing is the theoretical limit of data compression. Shannon's entropy states the more unpredictable an outcome is, the more data required to describe it. Information theory treats symbols of a message as independent and identically distributed random variables. This means that one symbol cannot affect the probability of another, for they are independent; unconnected. For example, in information theory, the probability of a fair coin landing on heads or tails is considered to be 0.5 and remains constant for each flip, no matter how many flips are made. Using Shannon's entropy, it is considered to be impossible to encode, on average, the outcome of a fair coin better than 1 bit. Compression methods are incapable of compressing random-like data because its average entropy is at maximum. Therefore, when redundant data is eliminated from a message, the probability distribution associated with the variable usually turns to a normal distribution, for all possible outcomes are considered equally probable. A theoretical limit of compression and computation of data is generally accepted in the known art.

In fact, it is not possible to compress all possible files or states using a single statistical model, as stated by the Pigeon hole principle, for there cannot exist an injective function that can take a large finite set to a smaller set. In other words, four pigeons cannot fly through three holes at the same time. When variables are considered to be mutually independent and all their possible states are treated as equally likely, then all possible sequences comprising mutually independent variables are also equally likely. This relates to the accepted idea that random data is a condition when all possible sequences are equally probable and is unable to be compressed without loss. Data compression methods in the known art are left at an impasse. This is the case for all high entropy data, such as: a binary executable, data simulation, compressed data, encrypted data or simply random data based on a source of natural phenomena, such as radioactive decay.

U.S. Pat. No. 6,411,228 to Malik titled "Apparatus and method for compressing pseudo-random data using distribution approximations" filed Sep. 21, 2000, however, describes a method and apparatus that claims it can compresses pseudo-random data by implementing a stochastic distribution model. In its claims, the stochastic distribution model is compared with the pseudo-random data. The difference data between the two is claimed to be generally less random than the other stochastic distribution and the pseudo-random data. It is claimed in the patent that the difference data can therefore be compressed. The difference data is included with the values required to generate the stochastic distribution, such as a seed value, which together allow a decoder to generate the original pseudo-random file.

The problem with this method is that the process that compares the stochastic model to the pseudo-random data is computationally expensive, for the process must compare a large number of stochastic models in order to find a "best" fit, which is a selection process that leads to the method generating the difference data. Another hurdle using stochastic models for encoding pseudo-random data is that the number of bits needed to describe the seed value to generate the pseudo-random data may also be as high as the number of bits required to describe the pseudo-random data itself. In addition, the stochastic models may not always match random data well enough, for it is generated by computer simulation and not from natural phenomena.

What is needed is a method, article comprising machine instructions and apparatus that can efficiently model the statistics of large sequences of data, analyze their patterns from a broad view, determine their probabilities, eliminate their redundancy and reduce the average entropy without loss. Because statistical models are the starting point for most data processing techniques, any way that allows a data processor to reduce the overall complexity of said models would result in an increase in speed and accuracy of data processing, such as for pattern recognition of human language, pictures and sounds. It would also allow for the transmission and storage of more data in less time, bandwidth, and space, as well as allow for the determination of a probability value for a sequence at a future time using forecasting, and for efficient data generation, such as random data without requiring devices to read naturally chaotic phenomena found in nature.

Unless the context dictates the contrary, all ranges set forth herein should be interpreted as being inclusive of their endpoints and open-ended ranges should be interpreted to include commercially practical values. Similarly, all lists of values should be considered as inclusive of intermediate values unless the context indicates the contrary.

SUMMARY OF THE INVENTION

The method, article comprising machine instructions, and apparatus presented in this inventive material solves many of the problems associated with data processing in the known art by identifying a subset of states out of a superset comprising all possible states of a data system. A data system, as presented in this inventive subject matter, is a system where data units are treated similarly to a system of atoms, that being an aggregate of interconnected and mutually dependent units that have non-uniform probability distributions and manifest, as a whole, one state.

Identifiers are created to represent at least one of the following: a state within the state subset and a boundary of the state subset. The identifiers allow a data processing device to generate a data system corresponding to one of the states comprised by the state subset. Data processing is made more efficient when a number of states comprised by the state subset is less than a number of states comprised by the state superset. When only the states within the state subset are considered, redundancy of information can be reduced, as well as the average information entropy. The result is a method, article comprising machine instructions, and apparatus that can efficiently model the probabilities of a data system's systemic characteristics, such as a large data sequence from the data system, a system's structures and the states of the data system itself without incurring a high cost to the data processor and memory as compared to other methods in the known art.

A state subset is identified using a model that describes a data system's systemic characteristics; its structures and relationships between data units. Such a model can be created using a set with added structure, such as a space, whereby elements of the space represent a possible state of the systemic characteristic. Probabilities associated with the elements are represented by a probability field within the space, allowing the method, article comprising machine instructions, and apparatus to eliminate redundant spatial forms and structured patterns.

To create a spatial statistical model, the method, article comprising machine instructions, and apparatus can receive and process an ordered sequence of units from the data system using a sequence function that outputs an output sequence corresponding to the ordered sequence. The method, article comprising machine instructions, and apparatus then corresponds the element of the space to the state of the member of the output sequence. The probability of the systemic characteristic, such as the state of the member of the output sequence, is determined by a number of correspondences between the element and the member. A spatial pattern is determined based on the structures added to the set, such as a dimension of the space, and the way in which the sequence function processes the ordered sequence.

When the probabilities of the possible states are determined, a positive probability subspace is identified within the space, which represents the data system's state subset. Any state representation of the data system, such as an element, comprised by the positive probability subspace indicates a correspondence between the state and the output sequence is probable. Any element representing a possible state that has a probability of zero is comprised in another region called a zero probability subspace. The system then constructs an ordered list of identifiers to represent states within the state subset, or the states of the members of the output sequences that correspond to the elements within the positive probability subspace. By receiving the ordered list of identifiers, a device can generate a sequence or data system in a state within the state subset.

Advantages

There are a number of advantages to the present method, article comprising machine instructions and apparatus. The first advantage is that less memory and storage is required to model the probable states of systemic characteristics compared to methods and apparatuses of the known art, particularly as the number of states rises exponentially due to an increase in the number of bits representing a word or string.

Other benefits of the present method, article comprising machine instructions, and apparatus include modeling characteristics of data systems using polygonal, parametric and continuous functions. Where mathematical functions in the known art approximate a signal within a domain, the present method, article comprising machine instructions, and apparatus utilizes a variety of functions to model the probable forms of the states of the system, which can be used to calculate the probability of a particular state deterministically. Polygonal, parametric and continuous functions can determine the probabilities of the possible states of the data system by selecting elements in the structured set as constraints, which signify the state subset's boundary. A continuous probability distribution function can determine probability distributions for the possible states using a continuous probability gradient. If required, a discrete probability distribution and a probability mapping function may also assign probability values explicitly to any state representation utilizing a reference.

For pattern recognition, the method or apparatus can use the spatial statistical model for matching characteristic patterns of data with known data systems or probability distributions.

The method, article comprising machine instructions, and apparatus can also apply the encoding steps iteratively. A sequence function reads the ordered list of identifiers as a new data system for the input in a successive iterative transformation cycle. A tree data structure can assist with the processing of these iterative cycles. When blocks of data are appended in the iterative process, the tree data structure allows the method, article comprising machine instructions, and apparatus to decode only selected blocks or files without decoding all the appended data blocks.

Another advantage is the ability to create a supercorrespondence of the states or members of the output sequences, similar to a superposition, where the method or apparatus corresponds at least two states of a systemic characteristic to the same element. Supercorrespondence can reduce the amount of space needed to represent all the possible states of a data system.

Other modeling techniques include using a structured set of two or more dimensions, using a plurality of structured sets, using spaces with a hierarchical multi-resolution structure, using vectors to plot out intervals of time, and using sets of probability distribution functions and maps.

Of the greatest advantages from this method, article comprising machine instructions, and apparatus is the ability to create a spatial statistical model for random-like data, which allows for its encoding/decoding, pattern recognition and generation, something which has been accepted by various techniques in the known art to be impossible. Such features include the ability to apply a random-like transformation function to transform a data system into the random-like data state when iteratively encoding data. The present method, article comprising machine instructions, and apparatus can encode for random-like data due to a hypothesis presented in this inventive material resting on an idea that random-like data is not a condition where all possible states of a data system are equally probable. Rather, the hypothesis states that random-like data is but one of the possible state subset types within a state superset.

Glossary

The term "data system" is used herein to mean a set, aggregate, collection or sequence of mutually dependent units of data, such as symbols, where each has non-uniform probability distributions for the unit's possible states. Such a data system comprises at least two or more mutually dependent variables or symbols, such as bits. For example, a sequence of 16 bytes may be a data system when the 16 bytes are received as and representative of a whole system. Therefore, anything similar to the following may be considered a data system: a computer file comprising bytes, an encoded message comprising symbols, a document comprising graphemes or alphanumeric symbols, a digital picture comprising pixels, a waveform file comprising samples, a video file comprising picture frames, an executable comprising machine code symbols, and a set of data systems in an operating system. Data systems can remain relatively static within a storage medium. The state of a data system can change due to the units themselves being rearranged and altered by a data processor and, in a possibly undesirable manner, by physical forces such as heat that influence a data processor. The state of a data system can also be influenced by the laws and processes of the units themselves. The state of a data system can also be random, containing no discernible order, which may be the result of dynamics or forces from the environment, model or a data processing machine, which may be unobservable due to limitations of a measuring device. The units may be represented in digital or analog form. In the context of this inventive material, a data system is not the data processing machine or system, which comprises interoperable components that process data signals, as in a computing device. A data system is not a collection of independent files where information does not connect the units together, such as a database or filing system on a storage medium. If, however, the files are treated as one stream or file, and a data processing machine is required to process the entire set of data in order to access one file, then the entire collection of data would be considered as a data system. While a data system can be broken into many separate units, such as files, like pieces in a puzzle, the information observed within each unit are not independent.

The term "data unit" or "unit of data" is used herein to mean components or elements of a data system. These units can be; bits, bytes, integers, floats, characters, pixels, wave samples, wavelets, vectors, functions, processes, subsystems and any other units that together contribute to a whole system of data that is intended to communicate a message or represent a system's larger state.

The term "information distortion by observation distortion" or "i.d.o.d." is used herein to mean a measure of the difference between an observed number of possible states for a data unit and an observed number of possible states for a system of data units (a data system) as it relates to a value.

The term "mutually dependent variables" is used herein to mean a mutually dependent relationship between two or more random variables. For example, a method or system generating one outcome may have an effect on another outcome. Unlike a Markov process, where the probability distribution of the present variable affects only the probability distribution of a subsequent variable, the probability distribution of one dependent variable can affect the probability distributions of all other dependent variables within the sequence or system.

The term "space" is used herein to mean a set of elements with one or more added structures, which gives the elements a relationship that allows a function to measure certain characteristics between them, such as a distance between one or more elements. An exemplary space is a phase space, where each point represents a unique state of a system. Another space may be a metric space, such as Cartesian coordinate system, Euclidean, Non-Euclidean spaces. A more abstract space would be topological spaces. On the contrary, a sequence comprises members that can repeat, where the relationship between members in a sequence is order only.

The term "member" is used herein to mean a member of a sequence, which is usually an ordered list of data units, such as the bits in a data stream or the graphemes in a sentence. When dealing within a context of a space, such members may correspond to elements of a set, though they are not generally defined as the elements they correspond to. Therefore, an element or point in the space is not a member, for the elements are related by at least one structure. Only when a correspondence connects an element in space to a member can a sequence be endowed with structure.

The term "supercorrespondence" or "supercorresponding" is used herein to mean corresponding at least two members of at least one sequence to the same element in a space. It is not unlike the superposition of two or more items at the same point in space, for corresponding a member to an element of a space is similar to positioning a member to a point. Technically, the method may not actually place a member on an element, but it can correspond two by a referencing system, mechanism or function using a data processing engine and system memory.

The term "state" is used herein to mean a condition, pattern or arrangement of data units. The state can also be an outcome of one or more variables that occurs at an interval of time or any other measure. For example, each of the 256 patterns of bits in an 8-bit sequence is a state of a data system 8-bit in size.

The term "state superset" is used herein to mean a set comprising all possible states of a data system.

The term "state subset" is used herein to mean a subset of a data system's state superset.

The term "systemic characteristic" is used herein to mean any aspect of the data system; a state, structure, unit of data, data subsystem, relationship between units or subsystems, processes, spatial forms, etc.

The term "probability field" is used herein to mean a space where its elements, which represent a possible state of a systemic characteristic, are permitted to be assigned probability values. For example, if the number of possible states for a member in a sequence at an interval of time is 256, then the elements at that interval of the probability field would include states 0-255, where probability values may be determined. For this example, the probability field would not include a point corresponding to any value 256 and above because 256 is not one of the possible states.

The term "spatial redundancy" is used herein to mean information that is not required to describe the values of the elements of the space.

The term "positive probability subspace" is used herein to mean an area of the probability field where the points are determined to have a probability value indicating a correspondence between an element and a member is probable. For example, if a probability value greater than 0 indicates an outcome is probable to occur, then a positive probability subspace does not include a point determined to have a probability value of 0.

The term "zero probability subspace" is used herein to mean an area of the probability field where the points are determined to have a probability value indicating a correspondence between an element and a member is not possible. For example, if a probability of 0 indicates that it is impossible for an outcome to occur, then a zero probability subspace does not include a point determined to have a probability value greater than 0.

The terms "probability constraint elements" or "probability constraints" or "constraint elements" or "constraint boundary" are used herein to mean the elements, selected within a set with added structure, that signify a boundary that contains a positive probability subspace. For example, if 5 and 10 where probability constraints, they would "contain" numbers 6 through 9. Another possibility would be that constraints 5 and 10 would "contain" numbers 5 through 10.

The terms "probability mapping function" or "probability mapping" are used herein to mean an assignment of probability values to elements/points of a probability field. This can be generated by a probability distribution function that calculates a plurality of probability values based on the probability distribution of at least one output sequence and assigns the probability values to the points within a probability field. It may also be generated discretely for each point. A set of probability values is not a probability map. The values must be assigned to points.

The term "sequence function" is used herein to be defined as a process and a means for receiving a sequence of data units, processing that sequence using certain argument values and functions and generating an output sequence that can be processed back into its original sequence using the inverse of the sequence function.

The terms "sequence number" or "state number" are used herein to mean a number that references a unique sequence or state, usually within a set of states, such as a state subset. This number can be represented by an ordered list of identifiers.

The term "base symbol" is used herein to mean the symbol based on the base number for a logarithm. The base symbol is also a data unit. For example, for the equation $\log_2 16$; the base symbol is 2, which is represented by one bit, a data unit. Four bits can describe 16 possible substates.

The term "transformation cycle" is used herein to mean a series of processes and a means for, by a data processing engine and device, to transform and encode a data system.

The term "generation cycle" is used herein to mean a series of processes and a means for, by a data processing engine and device, to generate and decode a data system based on the transformation cycle.

The term "pseudo-random data" or "random-like data" is used herein to mean a state of a data system that has no discernible patterns amongst its units of data, and where all possible states of a data unit occur with relative equal frequency across the data system. It may also be defined as a state where the average information entropy for each base symbol of a specified number of bits in a sequence is maximal, based on Shannon's theory of information.

Further objects, features, aspects and advantages of the inventive subject matter will become more apparent from a consideration of the drawings and detailed description three example embodiments.

BRIEF DESCRIPTION OF THE DRAWING

FIG. 6 is an exemplary graphic chart displaying a distribution of members corresponding to elements of two different spaces, according to the present inventive subject matter;

FIG. 9 is an exemplary of two graphic charts displaying members of output sequences corresponding to elements of a set with added structure or a space, according to the present inventive subject matter;

DETAILED DESCRIPTION

The following is a detailed description of the inventive subject matter, which may be implemented by a machine device containing a data processor that executes a set of machine instructions stored within a storage medium, such as a hard drive or memory mechanism. The machine instructions may then be adapted to direct the device to execute the methods described within this inventive subject matter. The present inventive material may also be implemented by a device or machine that is made to perform the process and steps without machine instructions, such as a specialized processor or machine. Likewise, the inventive subject matter may be considered as a process, which can be implemented by a data processor stored in a data processing device.

Overview

Figure 1:
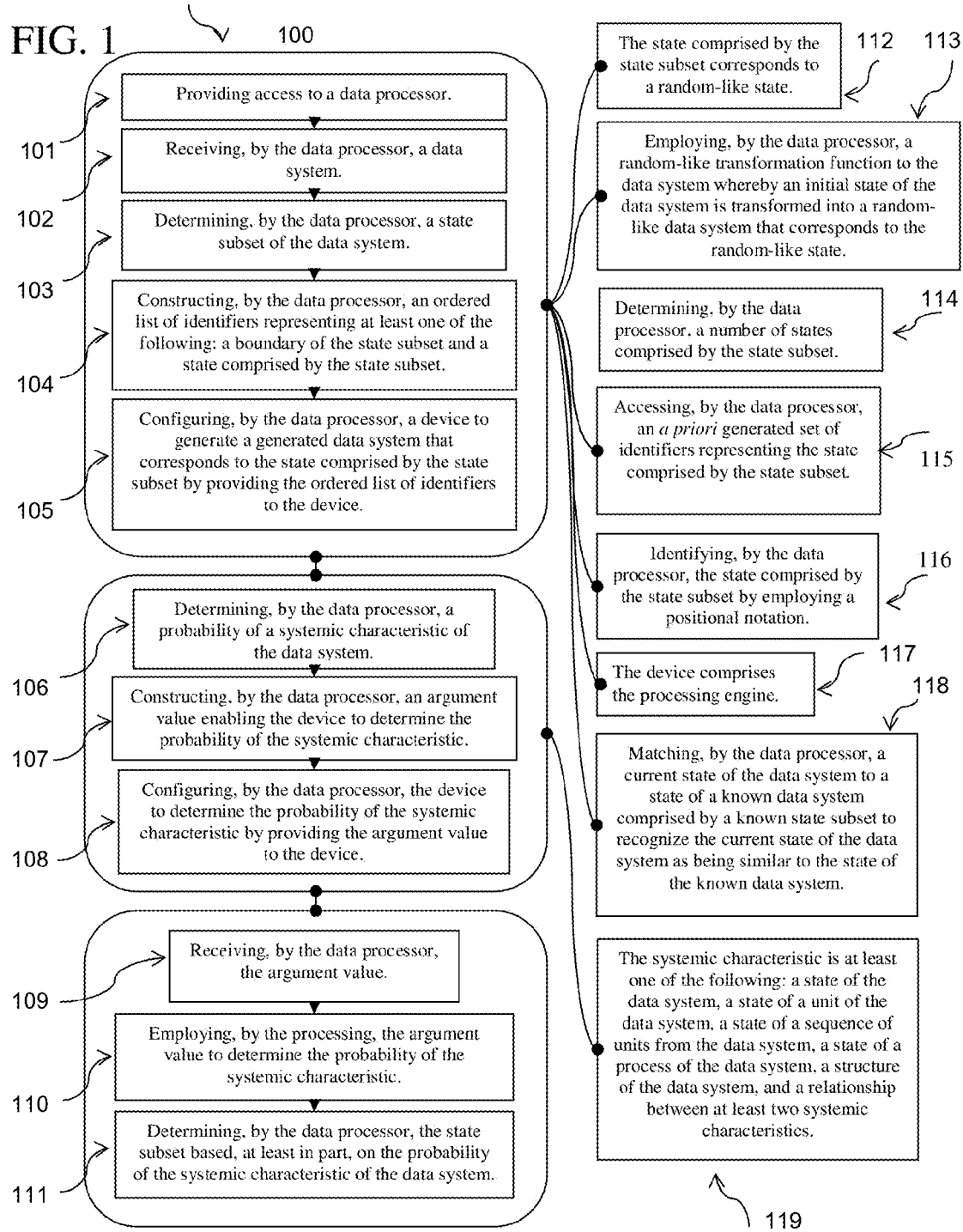
FIG. 1 is a chart displaying operations of the present method, set of machine instructions and apparatus.
Figure 2:
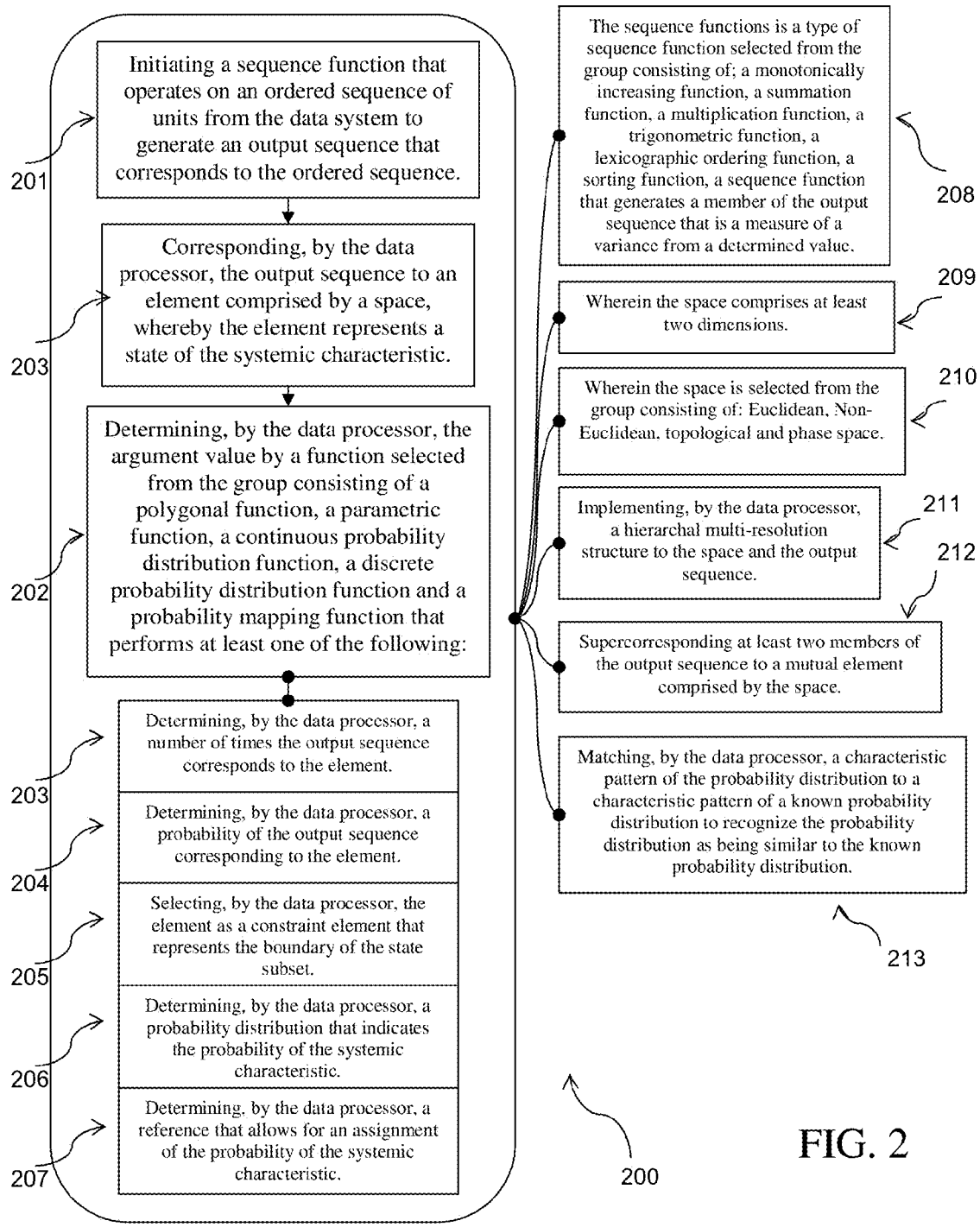
FIG. 2 is a chart displaying operations of the present method, set of machine instructions and apparatus.
Figure 3:
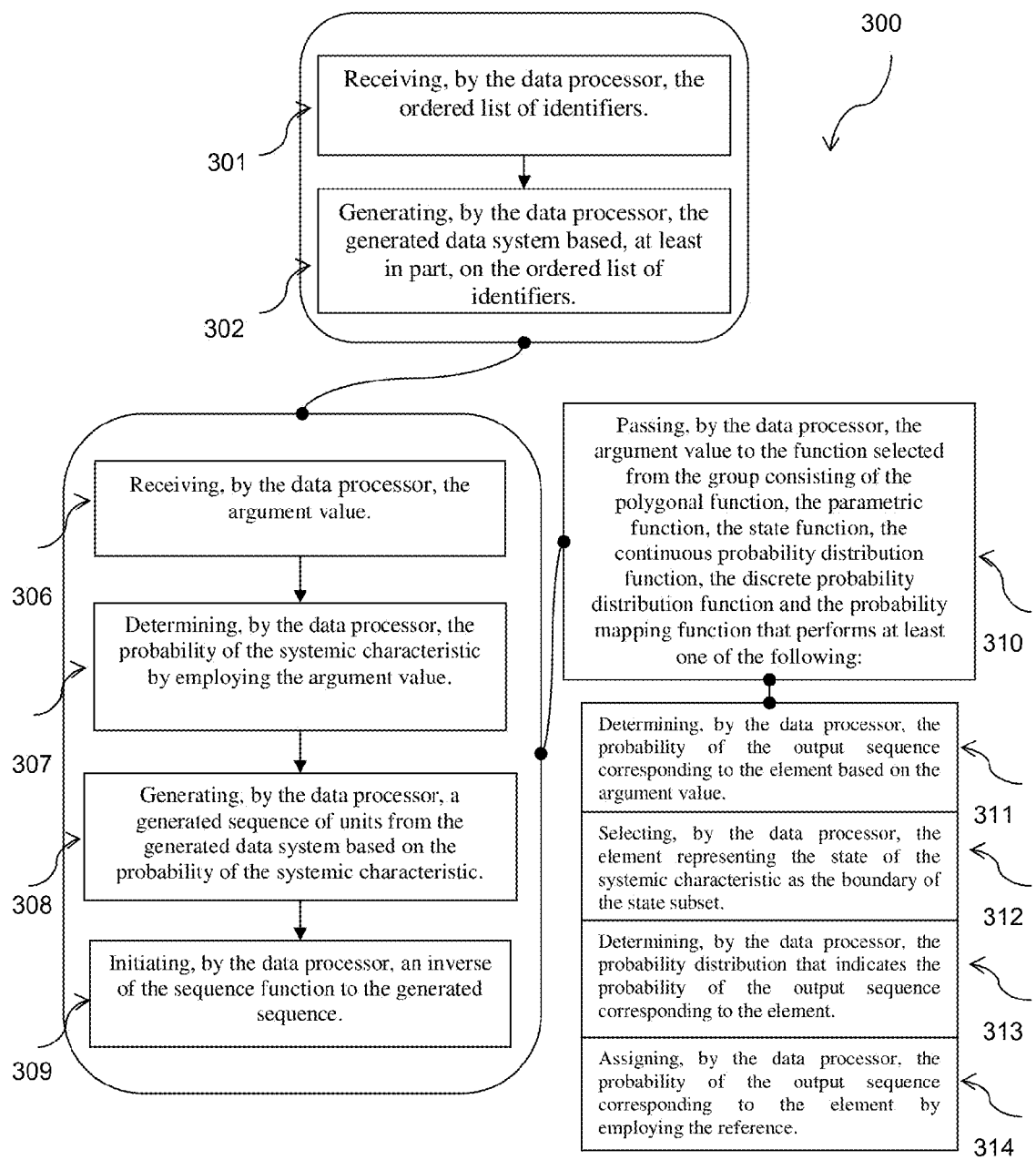
FIG. 3 is a chart displaying operations of the present method, set of machine instructions and apparatus.

The steps and elements of the inventive subject matter are exemplified in FIG. 1, FIG. 2 and FIG. 3. Step 101, which is providing access to a data processor. Step 102 is a method and means for receiving, by the data processor, a data system, which includes a sequence of data units, such as bits, bytes, words, etc. The data system may be stored in a storage medium, which must be accessed by the data processor. The data system may also be received through a transmission from an internet connection and then stored on the storage medium, which may then be accessed by the data processor. Step 103 is a method and means for determining, by the data processor, a state subset of the data system, the details of which are described in the example embodiments. Step 104 includes constructing, by the data processor, an ordered list of identifiers representing at least one of the following: a boundary of the state subset and a state comprised by the state subset. The identifiers may be constructed by writing bit patterns unto the storage medium. Step 105 is method and means for configuring a device to generate a generated data system that corresponds to the state comprised by the state subset by providing the ordered list of identifiers to the device, which may be allowed by an electronic interconnect from the processor to the device.

Steps 106-119 are sub-elements to 101-105. These include: step 106, which is method and means for determining, by the data processor, a probability of a systemic characteristic of the data system. Step 107 is method and means for constructing, by the data processor, an argument value enabling the device to determine the probability of the systemic characteristic. Step 108 is method and means for configuring, by the data processor, the device to determine the probability of the systemic characteristic by providing the argument value to the device. Step 109 is receiving, by the data processor, the argument value. Step 110 is method and means for employing, by the data processor, the argument value to determine the probability of the systemic characteristic. Step 111 is method and means for determining, by the data processor, the state subset based on the probability for the systemic characteristic of the data system.

Elements 112-119 derive from steps 101-105. Element 112 states that the state comprised by the state subset may correspond to a random-like state. Element 113 is a method and means for employing, by the data processor, a random-like transformation function to the data system, whereby an initial state of the data system is transformed into a random-like data system corresponding to the random-like state. Elements 114, 115 and 116 are comprised by step 104. Element 114 is a method and means for determining, by the data processor, a number of states comprised by the state subset, particularly by an enumeration calculation. Element 115 is a method and means for accessing, by the data processor, a generated set of identifiers representing the state comprised by the state subset. Element 116 is a method and means for identifying, by the data processor, the state comprised by the state subset by employing a positional notation. The device can comprise the data processor, as shown by element 117. Element 118 is a method and means for matching, by the data processor, the probability of the systemic characteristic of the data system to systemic characteristic of a known data system to recognize a current state of the data system as being similar to a state of the known data system. Element 119 further exemplifies what a systemic characteristic can be: a state of the data system, a state of a unit from the data system, a state of a sequence of units from the data system, a structure of the data system, a relationship between at least two systemic characteristics of the data system.

FIG. 2 shows steps 201, 203 and 202, which are further comprised by step 106 of determining the probability of the systemic characteristic. Step 201 is a method and means for initiating a sequence function that operated on an ordered sequence of units from the data system to generate an output sequence that corresponds to the ordered sequence. Step 203 is a method and means for corresponding, by the data processor, the output sequence to an element comprised by a space whereby the element represents a state of the systemic characteristic. Step 202, which is comprised by step 107, is a method and means for determining, by the data processor, the argument value, particularly by a function selected from the group consisting of: a polygonal function, a state function, a parametric function, a continuous probability distribution function, a discrete probability distribution function and a probability mapping function that performs at least one of the following: element 203, which is a method and means for determining, by the data processor, a number of times the output sequence corresponds to the element; element 204, which is a method and means for determining, by the data processor, a probability of the output sequence corresponding to the element; element 205, which is a method and means for selecting, by the data processor, the element as a constraint element that represents the boundary of the state subset; element 206, which is a method and means for determining, by the data processor, a probability distribution that indicates the probability of the systemic characteristic; and element 207, which is a method and means for determining, by the data processor, a reference that allows for an assignment of the probability of the systemic characteristic.

Elements 208-213 further describe elements 201-207. Element 208 states that the sequence function is a type of function selected from the group consisting of a monotonically increasing function, a summation function, a multiplication function, a trigonometric function, a lexicographic ordering function, a sorting function, a sequence function that generates a member of the output sequence that is a measure of a variance from a determined value. Element 209 states that the space further comprises at least two dimensions. Element 210 shows that the space can be a type of space that is selected from the group consisting of Euclidean, non-Euclidean, topological and phase space. Element 213 is method and means for supercorresponding at least two members of the output sequence to a mutual element comprised by the space. Element 213 is method and means for matching, by the data processor, a characteristic pattern of the probability distribution to a characteristic pattern of a known probability distribution to recognize the probability distribution as being similar to the known probability distribution.

FIG. 3 displays the elements for generating a generated data system that begins with step 301, which is a method and means for receiving, by the data processor, the ordered list of identifiers. Step 302 is a method and means for generating, by the data processor, the generated data system based, at least in part, on the ordered list of identifiers. Steps 306-308 are comprised by steps 301-302. Step 306 is a method and means for receiving, by the data processor, the argument value. Step 307 is a method and means for determining, by the data processor, the probability of the systemic characteristic by employing the argument value. Step 308 is a method and means for generating, by the data processor, a generated sequence of units from the generated data system based, at least in part, on the probability of the systemic characteristic. Step 309 is a method and means for initiating, by the data processor, an inverse of the sequence function to the generated sequence.

Element 310, comprised by step 307, is a method and means for passing, by the data processor, the argument value to the function selected from the group consisting of the polygonal function, the parametric function, the state function, the continuous probability distribution function, the discrete probability distribution function and the probability mapping function that performs at least one of the following: element 311, which is a method and means for determining, by the data processor, the probability of the output sequence corresponding to the element based, at least in part, the argument value; element 312, which is a method and means for selecting, by the data processor, the element representing the state of the systemic characteristic as the boundary of the state subset; element 313, which is a method and means for determining, by the data processor, the probability distribution that indicates the probability of the output sequence corresponding to the element; and element 314, which is a method and means for assigning, by the data processor, the probability of the output sequence corresponding to the element by employing the reference.

Examples of the aforementioned steps and elements of the present method, machine instructions and apparatus are described in greater detail in the following paragraphs. The following detailed descriptions and example embodiments should in no way be construed to limit the nature of the inventive subject matter. The descriptions and examples provided should be interpreted to their broadest possible extent.

Description of the Device

Figure 4:
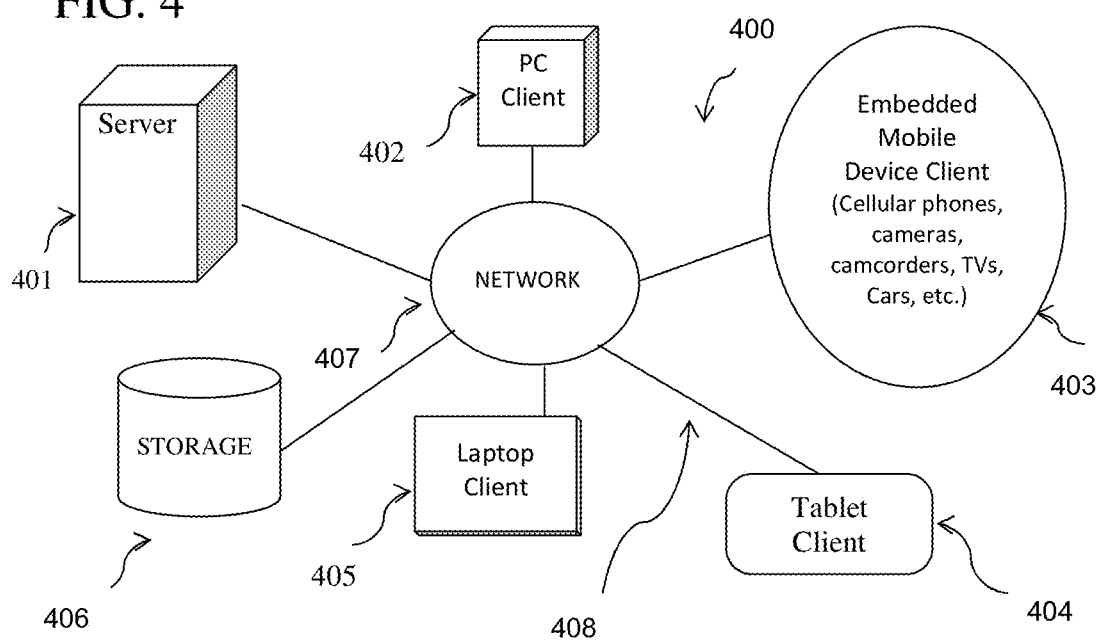
FIG. 4 is an exemplary diagram illustrating a distributed data processing system according to the present inventive subject matter.

With reference now to FIG. 4, which is a representation of a distributed data processing system, which is a network of computing devices in which the present inventive subject matter may be implemented. Distributed data processing system 400 contains network 407, which is an internet means used to provide communications links between various devices and computers connected within distributed data processing system 400. Network 407 may include permanent connection, such as wire or fiber optic cables, or temporary connection made through land-line or wireless connections.

In the depicted example, server 401 is connected to network 407, along with storage unit 406. In addition, clients 402, 403, 404 and 405 are also connected to network 407 by connections, such as connection 408. These clients, 402, 403, 404 and 405 may be, for example, personal computers or network computers. For purposes of this application, a network computer is any computer coupled to a network which receives a program or other application from another computer coupled to the network. In the depicted example, server 401 provides data or information, such as boot files, operating system images and applications to clients 402-405. Clients 402, 403, 404 and 405 are clients to server 407. Distributed data processing system 400 may include additional servers, clients, and other devices not shown.

In the depicted example, distributed data processing system 400 is the Internet, with network 407 representing a worldwide collection of networks and gateways that use the TCP/IP suite of protocols to communicate with one another. At the heart of the Internet is a backbone of high-speed data communication lines between major nodes or host computing devices consisting of many commercial, government, education, and other computer systems that route data and messages. Of course, distributed data processing system 400 also may be implemented as a number of different types of networks such as, for example, an intranet or local area network. The connection 408 may use electricity by a cable, use light by fiber optics, and electromagnetic by a wireless means. FIG. 4 is intended as an example and not as an architectural limitation for the processes of the present inventive material.

Figure 5:
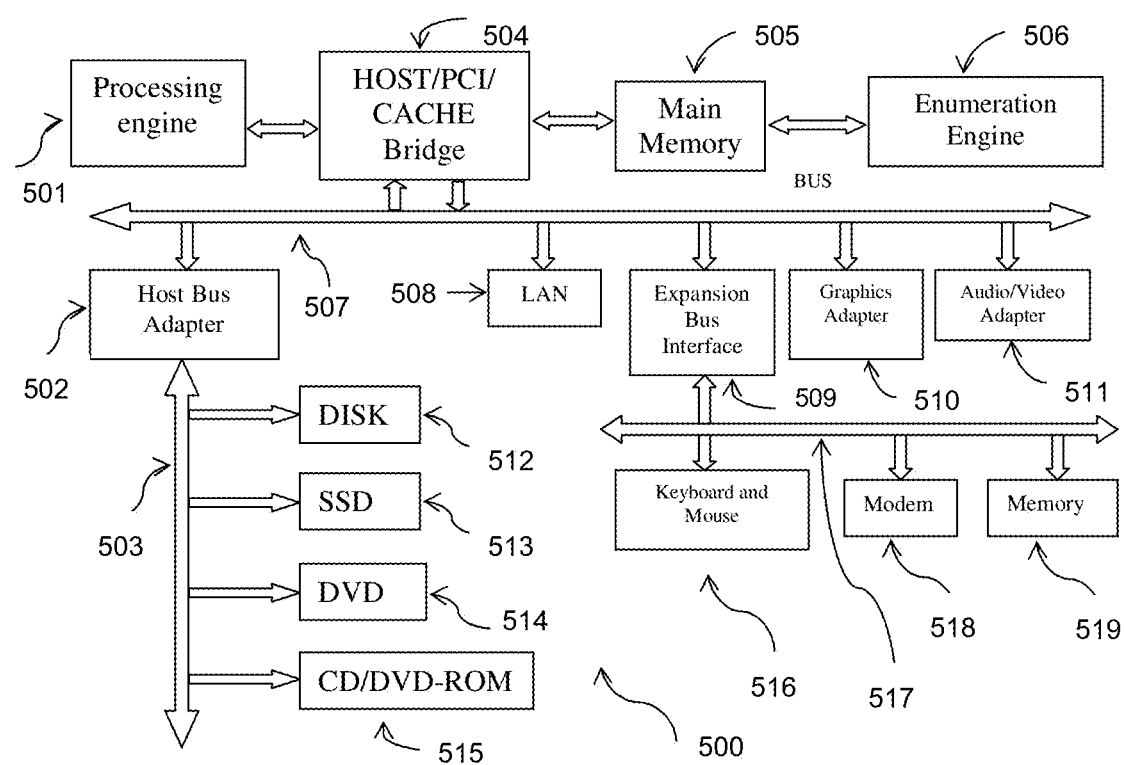
FIG. 5 is an exemplary block diagram of a client data processing device according to the present inventive subject matter.

With reference now to FIG. 5, which illustrates a block diagram of a data processing system that may perform the data processing techniques described in this present inventive material. Data processing system 500 is an example of a type of client computing device, such as a data server, personal computer, mobile phone, tablet or other type of data processing system. Data processing system 500 employs a peripheral component interconnect (PCI) local bus architecture 507. Although the depicted example employs a PCI bus, other bus architectures, such as ISA, may be used.

Data processor 501, main memory 505 and enumeration engine 506 are connected to PCI local bus 507 through PCI Bridge 504. PCI Bridge 504 may also include an integrated memory controller and cache memory for processor 501. Additional connection to PCI local bus 507 may be made through direct component interconnection or through add-in boards. In the depicted example, local area network (LAN) adapter 508, Host Bus Adapter 502 and expansion bus interface 509 are connected to PCI local bus 507 by direct component connection.

In contrast, graphics adapter 510, and audio/video adapter (A/V) 511 are connected to PCI local bus 507 by add-in boards inserted into expansion slots, or as integrated chips in the main motherboard. Expansion bus interface 509 provides a connection for a keyboard and mouse adapter 516, modem 518, and additional memory 519.

In the depicted example, host bus adapter 502 provides a connection for a storage means: hard disk drive 512, Solid State Drive (SSD) 513, CD/DVD-ROM drive 515, and digital video disc drive (DVD) 514.

An operating system runs on data processor 501 and is used to coordinate and provide control of various components within data processing system 500 in FIG. 5. The operating system may be a commercially available operating system, such as GNU Linux.

An object oriented programming system, such as Java, may run in conjunction with the operating system, providing calls to the operating system from Java programs or applications executing on data processing system 500. Machine instructions for the data processing system, the operating system and applications or programs may be located on a storage device, such as hard disk drive 512, SSD 513 or a DVD-ROM disk using DVD-ROM drive 515 and may be loaded into main memory 505 for execution by data processor 501.

Those of ordinary skill in the art will appreciate that the hardware in FIG. 5 may vary widely depending on the implementation. For example, other peripheral devices, such as optical disk drives and the like, may be used in addition to or in place of the hardware depicted in FIG. 5. Other examples, such as home entertainment devices (gaming consoles, DVD players, cable receivers) mobile devices (cellular phones, tablets, portable game devices, cars, etc.) may employ a variety of configurations, alterations, or deletions of said items or implementations in FIGS. 4 and 5. The depicted example is not meant to imply architectural limitations with respect to the present inventive subject matter. For example, the method, article comprising machine instructions, and apparatus of the present inventive material may be applied to multiprocessor systems. The signals that may be employed by the data processing system 500, the data processor 501, main memory 505 and interconnects 503, 507, 517 used to process data may be electronic using electrons and other elementary particles, photonic using photons, sonic using phonons and other energetic means such as inducing magnetic fields to represent bits of data. These signals may be represented in either digital or analog form. The data processing device may also use signals that allow for a superposition of more than one state, such as a qubit of a quantum computer where the qubit superpositions a vertical and horizontal polarization, representing both bits of 1 and 0 simultaneously.

The present method, article comprising machine instructions, and apparatus provides a way by which a data system may be processed using a data processing device. The present inventive subject matter may be implemented on a server device, client device, stand-alone computing device, and the like. The present inventive subject matter will be described in terms of functional devices which may be implemented in hardware and software, using the server device and/or client device in FIGS. 4-5, for example. The method described may be embedded in hardware, within a specialized processing unit, such as enumeration engine 506 that calculates enumerations functions faster than the general data processor 501, or from the article and storage means that comprises the machine-readable instructions, which may then be stored in memory or a storage device, such as disk drive 512. The functional devices may incorporate one or more elements of the client/server devices shown in FIGS. 4-5.

In order to provide the mechanism set forth above, a server, client device, or stand-alone computing device, may be used to implement the method, article comprising machine instructions, and apparatus described within the present inventive material.

Theory of Operation

The principle of this inventive subject matter rests on the idea that variables are mutually dependent and have non-uniform probability distributions as they are representative of a state of a system as a whole, which can be affected by systemic forces and various other characteristics. The probabilities associated with states of a unit of data can be analogous to the probabilities associated with states of momentum of an atom or molecule. A number of states exist in a system of matter, which can be divided into four basic phases: solid, liquid, gas and plasma. These phases may be considered subsets within a larger superset comprising all possible states of the system of atoms and molecules. Each phase or subset contains states with similar characteristics, such as the momentum of the particles. For example, when molecules of water reach higher levels of energy, they shift from the solid phase to the liquid phase. Additionally, the molecular shape and electric charge of the water molecules affects the system's state based on environmental conditions. The present inventive material treats a data system in a similar fashion.

Information theory states that random variables from a sequence are considered mutually independent and identically distributed, meaning their probability distributions are uniform across each variable. The hypothesis being presented in this inventive material considers random variables to be mutually independent only when each variable exists within a closed system. If the variables reside within a unified system, then the present hypothesis considers the variables to be mutually dependent and the probability distributions for each variable are considered non-uniform. For example, when fair coins are flipped in a sequence by the same flipper, they are not, based on the present hypothesis, considered mutually independent when the coins are being flipped by the same flipper, which is considered to be one unified system. This is valid even when the intervals between the flips vary. A random pattern of coins is hypothesized to be the result of various systemic forces and attributes, which may either be known, unknown or immeasurable to the observer. The cumulative effects of such forces, however, are not inconsequential, for a measurable effect may be observed in the course of time.

This idea of mutually dependent variables of a data system relates to another aspect presented within this inventive subject matter called information distortion by observation distortion (i.d.o.d.), which is a measure of a difference between a number of possible states for a unit of data, and a number of possible states for the system of units as it relates to a value, such as a probability distribution. Information distortion by observation is hypothesized to occur when a system is measured, resulting in units of measurement, which distorts the observation and thus distorts the information being offered by the units of measure. An example would be a probability distribution assigned to the possible states of the byte, which indicates the probability of each possible state the byte can have along a sequence. Because the probability distribution assigns probabilities to the states of the byte and not to the state of the sequence as a whole, the information being described by the probability distribution is distorted based on the measurement of a byte. Any probability distribution assigned to the states of the byte based on a probable frequency cannot account for all states of the sequence. For instance, if the probability distribution assigns relatively equal probabilities, where each state of the byte is expected to occur a relative equal number of times throughout the sequence, then the distribution would not account for all possible states of the sequence that do not have all states of the byte occurring with relatively equal frequency. A probability distribution with little information distortion by observation would assign probabilities to the entire set of possible states of the sequence or data system, where a probability of 1 (certainty) would be assigned to one possible state, leaving all others a probability of 0 (not possible). A set of probability distributions that changes along a sequence of data units may also lessen information distortion, as the probabilities fill the entire sequence. The problem is that any probability model with little information distortion may also be the most impractical using methods in the known art, such as an indexes, dictionaries, and mathematical functions, for it requires the same amount of information or more to describe the model than it does to describe the state of the data system.

As presented in this inventive material, a measure of the i.d.o.d. can be utilized to calculate and identify a state subset based on the probabilities of a data system's characteristics, such as a system's overall structure in a space. One example would be to calculate all the probable states of a data system where the possible states for a byte are observed with relative equal frequency. The set of probable states would then be determined as a state subset of the data system.

Another way the present method, article comprising machine instructions, and apparatus determines a state subset of a data system is by modeling the data system's changing probability distributions along intervals using a space, which represents a probability field. Probabilities of the systemic characteristics are determined by elements of the probability field, which represent a possible state of the systemic characteristic. As a whole, the probability field represents the probabilities of a system's form, which allows for efficient modeling of data sequences of relatively large lengths without incurring a huge cost to memory and processing resources, as is the case with methods in the known art.

An appropriate analogy for understanding i.d.o.d. and the nature of a probability being assigned to a field or medium in space would be a spinning propeller of an airplane. The propeller may have only two blades. Yet as they spin, the blades appear as a blurred disk due to the eye's persistence of vision. At that moment, the exact position of the blades cannot be measured by the eye. However, the observer is viewing the blades from a much broader perspective, where all the possible positions or states of the two blades can be seen in one moment when their blurred motion takes on a shape. If the observer were to take a picture of the spinning propellers using a high-speed shutter camera, the position of the blades would be known at that exact moment in time, yet their velocity would not. Thus a distortion is brought to bear. The observation has been distorted to a single frame, and therefore, so has the information about the spinning blades, which has now become a more finite observation than when the blades are seen in motion. If one were to treat a sequence of pictures made from a high speed shutter camera at various intervals as mutually independent variables with no relationships between them, then it would be impossible for an observer to know the true nature of the propellers, which is that they are spinning An analogy of a data system's structure and i.d.o.d may also be seen with motion pictures. A movie appears to unfold before the eyes of the observer. And yet, the movie has already been made; the rolling sheet of celluloid travels across a light in a projector. As the rapid succession of frames creates an illusion of movement, the interconnectedness of the frames can be observed, the structure of the movie, which is lies beyond the single frame. While a moment to an audience may be experienced as one second, that moment contains 24-30 picture frames. Looking further in, the frame comprises other moments, which are the millions of pigments in the celluloid (or digital pixels). Moving further, the pixels are represented by a series of bytes. And finally, the bytes make up a sequence of bits. The definition of the outcome changes by the way the movie is measured. Measuring a system results in a distortion of the observer's view from the system's higher structure, which in the analogy of the motion picture, is the characters, the story, the movement . . . the movie's systemic characteristics.

Another feature to modeling probabilities of systemic characteristics using a space is that a compression of the probability field may be achieved using a sequence function that structures a state dimension so that the members of one sequence supercorrespond with members of the same sequence or of different sequences. For example, when the number of states of a data unit is summed monotonically along a dimension of time, many of the members of all the possible sequences correspond to mutual elements. When the sequences supercorrespond in this way, less information is required to describe all the possible states represented by the space, for the field is essentially compressed.

For example, a byte can represent 256 possible sequences of bits. Assigning probabilities to each state result in 256 assignments. However, if a space represented the 256 possible states as monotonic 8-bit sequences, where the x axis signifies the length of the sequence in bits (the time dimension) and the y axis signifies a summation of the possible states of the bit (1 or 0) at each interval on x (8 being the highest value on y), then the number of possible elements to associate probability values to in this space would be 44, not 256, since many of the possible sequences correspond to mutual elements. Likewise, for a data system of 128 bits, the number of possible states is $3.4028 \times 10^{38}$. However, the number of elements in a space containing all the possible monotonic 16 byte sequences, where the numeric value of the state at each interval of the sequence is added to the previous member, is 34,696, which is a significantly lesser number to determine probabilities for, yet it accounts for all the possible states of the 128 bit data system.

A set of identifiers that represent each state comprised by the state subset need not be constructed, either statically or adaptively, or appended with the ordered list of identifiers as is the case for an index or dictionary in the known art. The identifiers can be constructed using an enumeration calculation, which determines the probable states within a state subset type, such as a random-like state subset type, which an indicator may denote along with the ordered list of identifiers.

In addition to what has been previously described, a variety of different functions may also be used to assist in determining probabilities of systemic characteristics, other than using a function that explicitly assigns a probability to a state of the state subset. One such function may select constraint elements that represent a state subset's boundary. For example, if a one dimensional line contains 100 elements and element "30" and "70" are selected as constraints, then the two will delineate areas of space to establish a state subset. If the positive probability subspace is "inside" the boundary, all elements between "30" and "70" will be determined to have a probability value of 0.025, as well as the corresponding state the element represents. Using a referencing calculation, an identifier representing element "31" would be read by the decoder as the first element "0" whereas element "69" would be read as element "39." The referencing calculation enables the decoder to know that identifier "0" refers to element "39", identifier "10" refers to element "49" and identifier "39" refers to element "69." Any state corresponding to elements "30-70" are considered to be within the state subset, whereas all other states represented by elements below "39" or above "70" are considered not probable or outside the state subset's boundary. Using this technique, the number of probable states is reduced to 40, where there were originally 100. Such functionality cannot be achieved without adding structure or relationships to the states. A variety of boundaries can be created using polygonal and parametric functions that can generate lines, polygons, curves and other smooth shapes to facilitate the determination of the subset boundary.

Implementing the hypothesis regarding data systems and information distortion by observation distortion allows the present method, article comprising machine instructions, and apparatus to compress and generate random data efficiently. When randomness is considered as a type of state subset, and the number of states within the random-type subset is less than the number of all possible states of a data system, then the average information entropy of the data system in the random-like state can be reduced.

FIG. 6 includes a graph 600 that depicts a space comprising a multitude of members 605 of a series of monotonic sequences from a data system in the random-like state. The members 605 appear as dots corresponding to each interval on the x axis 608. The dots in graph 600 appear as vertical lines at each interval, but this is merely an effect due to the dots being in close proximity to each other and because the sequences are superimposed in the graphs due to supercorresponding the members to mutual elements. The members gather around a mean value of 2040, which is indicative of a normal distribution. Because the set of random sequences reveals their systemic characteristic as a pattern within the probability field (where the corresponding elements do not take up the entire space), the method can use the model to describe the random state subset type.

Using a structured set or space as a means to model the probable states of a data system is by no means a limitation of the present inventive material. Any method or apparatus that is able to identify the state of a data system as corresponding to at least one state within a state subset out of its state superset, applies to this method, article comprising machine instructions and apparatus. The following sections contain example embodiments.

First Example Embodiment

The present description of a first example embodiment describes how the present method, article comprising machine instructions, and apparatus can decrease the average entropy of a random-like sequence of 16 bytes. This is accomplished by determining a random-like state subset based on a spatial model. The description goes on to describe how to encode the sequence, a state within this state subset, by enumerating the number of probable sequences and using a positional notation to encode the state. These steps are described in the following stages: first, determining a state subset for random-like data system; second, receiving a 16 byte data system/sequence and constructing the ordered list of identifiers to represent the state of the sequence comprised by the state subset; third, configuring a device to generate the 16 byte random-like sequence by providing the ordered list of identifiers to the device.

Spatial Statistical Model

One of the ways of determining the state subset of a data system is to determine the probability of its systemic characteristics within the context of a set with added structure such as a space. In this first example embodiment, a spatial statistical model is constructed for random-like data, although any type of data can be modeled using a space.

The process of creating a spatial model begins with establishing the set with added structure. In this present embodiment, the space is a Euclidian/phase space with two dimensions; a state dimension signified by a y axis, and a time dimension signified by an x axis. The state dimension refers to the possible states of the systemic characteristic, which in this example is the state of a unit of data; one byte. FIG. 6 shows two such spaces; space 600 and space 612. The visible points 605 and 616 represent the elements that correspond to members (bytes) of output sequences processed by a sequence function. Space 600 shows the corresponding members of output sequences from a random-like data file. Space 612 depicts the corresponding members of output sequences from a bitmap image file. The two spaces are presented to show how different types of data systems may have dissimilar structural patterns in space. It is the creation and utilization of space 600 that is used in the first and second examples as the model for a random-like data system.

The structured set or space can be recorded in computer memory as an array data comprising two dimensions. Programming languages, such as C and C++, allow the coding of array or vector data types. An example of how this may be written would be as follows: int space [16][4080], where "space" is the name of the set or integer array with 16*4080 elements. The structure that is being added is the relationship of the 4080 elements that correspond to each of the 16 elements, which gives 16*4080 total elements. In this present embodiment, the space, as exemplified by 600 and 612, is constructed to have two dimensions; one for x, 608 and 619, and one for y, 609 and 620, which creates a 2 dimensional space or, a 2 dimensional array referenced in a data processing system's memory. Because 16 byte sequences are modeled in the first example embodiment, the maximum interval value for the x axis is 15, which is the number of members in the output sequences from 0-15. The y axis signifies the summation value of the states, which in this example is 0-4080, as the maximum value for an 8 bit symbol is 255 (0-255): 255*16 is 4080. When plotted using the sequence function, the members create a monotonic sequence in the context of a two dimensional space. The process of the sequence function is explained in subsequent paragraphs.

Using the space, the current state of the members of an output sequence is matched to the element of the space. To do this, the process must know how a member is defined. In this first example, the process uses a symbol set criteria, which defines what a unit of data is and how the data units should be read. The criteria for the symbol set may be:

1. A number of bits: For example, the system could choose 4 bits, 8 bits, 16 bits or any number below the total size of the data system.

2. A selection of symbols to use out of the total possible based on the number of bits determined in #1 above. For example, the system can choose 10 symbols out of the total 16 possible symbols of a 4 bit set.

3. The locations in the data stream to change the criteria of the first two options. This allows for a dynamic change to the types of symbols the method can use. As an example, it may read a 4 bit symbol, then an 8 bit symbol, and then a 24 bit symbol, and repeat this cycle throughout the data stream.

In the first example embodiment, the symbol set is defined as 8 bits in length (1 byte), where all possible states of said bit length are allowed until it reaches the end of the data stream. However, as exemplified above, this particular choosing of said criteria of a data unit is not a limitation of this aspect of the method or apparatus and should be interpreted as a broad guideline for what is possible.

To model a state subset of a data system using the spatial statistical model, the method must read an adequate number of data systems with similar systemic characteristic patterns. The modeling begins with receiving a number of known random-like data systems by a sequence function that reads an ordered sequence of 16 bytes from the data system. For example, if a data system were 16,000 bytes in size, the sequence function reads a sequence of 16 bytes, and then reads the 17th byte as the 1st byte in a new 16 byte sequence. This would split the data system into 1000 ordered sequences. The sequence function should read an adequate number of ordered sequences from as many similar data systems as possible in order to create an accurate model. The present example does not specify the number of data systems to use, for the possibilities are broad where no limitations need be provided or interpreted.

It should be made clear that the spatial model of the data system is based, in part, on how the sequence function processes the ordered sequences. Considering the possibilities, the present method, article comprising machine instructions, and apparatus is able to model data systems in a number of different ways dependent on said criteria. For example, the sequence function can model the 16,000 byte data system without dividing it into 16 byte sequences. The sequence function can process a single output sequence 16,000 bytes long. The sequence function could read sequences 256 bytes long. Splitting the data into smaller sequences, such as 16 bytes, allows the method to model a more manageable number of probable states in the spatial statistical model, for the greater the size of the sequences, the greater the number of possible states to model. However, splitting the data system into multiple sequences is not a requirement. Additionally, a sequence function need not be limited to reading the ordered sequence from the data system sequentially. As previously stated, based on the symbol set criteria, the sequence function may read the data sequence from the end to the beginning, reading rows from right-to-left, then left-to-right. The read pattern may also be a random-access type read, where the symbols are defined on a 2-dimensional array. There are many possibilities available to a sequence function, which should be considered to its broadest extent. Any ordered sequence based on the symbol space criteria can be used.

In this present embodiment, the sequence function inputs the ordered sequence, reads each byte sequentially and outputs a monotonic output sequence, where each state value of all preceding members (bytes) are added to the state value of the current member. It performs this for each 16 byte sequence. For example, if the values for the sixteen symbols within a sequence were to appear as follows; 2, 189, 240, 52, 0, 19, 25, 123, 207, 10, 10, 81, 147, 94, 202, 248; the resulting output sequence would be; 2, 191, 431, 483, 483, 502, 527, 650, 857, 867, 877, 958, 1105, 1199, 1401, 1649.

From the many possibilities contemplated, the sequence function may process the ordered sequence using a variety of methods beyond the summation function presented in this first example embodiment. Any sequence can be generated by the sequence function as long as the inverse of the sequence function generates the ordered sequence. For example, the sequence function can multiply each successive member in the ordered sequence; if the members in an ordered sequence are 10, 5, 8, and 7, the output sequence would be 10, 50, 400, and 2800, each member being multiplied by the previous product. In another embodiment, the sequence function may be a trigonometric function along with a summation function, where the output sequence takes the shape of a circle or spiral within a three dimensional space. For example, when using a trigonometric-summation sequence function, the state value of the member of the ordered sequence can determine the length of the radius at each step of creating the circle. The value of the radius for one member may then be added to the radius of the preceding members, where the state values of the members at each step are added to the state value before it. The output sequences will therefore create an expanding tube or spiral form in space. If the summation function is not applied when using a trigonometric function, then the tube or spiral will not expand, but have a straight uniform shape, as a tube or cylinder.

In another embodiment, the sequence function may use two different functions; a summation and a sorting function, which outputs two separate output sequences. In that embodiment, the first output sequence would be the state values of the ordered sequence sorted in lexicographic order and then made monotonic by the summation function. The other would be a sorting sequence, where the state of each member indicates a sort value that enables the inverse of the sequence function to arrange the members in the lexicographic order back into their original unsorted sequence. For example, if the original ordered sequence was the following; 42, 150, 0, 96, 250, then the lexicographic output sequence would be 0, 42, 96, 150, and 250. The first member of the sorting sequence would have a value of 2, for "0" is the third member of the ordered sequence, and therefore must be moved 2 slots from the first slot, whereas 42 and 96 are pushed to slots 1 and 2. The resulting sequence would be 42, 96, 0, 150, and 250. Slot 3 is marked as set and will not be counted in subsequent iterations. The second member of the sorting sequence would be "0", since "42" is now the first member of the sequence in the current iteration and thus is not required to be moved. The first slot is now marked as set. The third member of the sorting sequence is 1, for "96" must be moved one slot to be in the forth slot as it skips over the third slot, which has already been marked as set. Because "150" is now in the second slot in the next iteration, the final member of the sorting sequence is 0. The resulting sorting sequence is then as follows: 2, 0, 1, and 0, which may be then summed to generate a monotonic sequence; 2, 2, 3, 3.

In another embodiment, the sequence function can output delta values, which represent the difference between two or more members. For example, based on the preceding sequence of 0, 42, 96, 150, and 250, its delta sequence would be 0, 42, 51, 54 and 235, where the members measure the difference between a current member and a preceding member.

In another embodiment, the sequence function may generate an output sequence where its members represent a measure of a variance from a determined value, such as a mean. For example, if the determined value is 128 and the state value for the member of the ordered sequence is 255, then the sequence function would output a value of 127 for the corresponding member of the output sequence.

Whatever way the sequence function outputs, it establishes, along with the structure of the space, how the data system is to be modeled to determine the spatial pattern inherent in the ordered sequence.

The next step is to call a state function that determines a correspondence between the members of the output sequences and the elements. When a number of correspondences is determined, the probability of the systemic characteristic can be determined. Matching the state of the member to the corresponding element gives structure to the sequence within the space. Out of the many possibilities contemplated, one way the state function can determine the correspondence between a member and an element is to add a value of 1 to all the elements of the data structure stored in computer memory each time a member corresponds to an element. For example, if the state value of the first member is 50, then a 1 would be added to the element of the data structure corresponding to the first element of the time dimension, and the 50th element of the state dimension. For the second member, if its state value is 250, a 1 would be added to the element referenced by the second element of the time dimension and the 250th element of the state dimension. In this manner, the number of times a member corresponds to an element is summed in the array data structure. Among the other possibilities, a third dimension may be employed that references the output sequence. For example, if there are 1,000 output sequences, the state and time dimensions would correspond to 1000 elements of the third dimension where each of the 1,000 output sequences are represented from 0-999. Using this technique, every output sequence will be modeled in its own two dimensional space; a value of 1 being added to the element corresponding to one of the one thousand output sequences. These are possible techniques for corresponding members to the elements of the structured set, and should not be considered to limit the scope of the present method, set of machine instructions and apparatus, rather they should be perceived as only examples within a broad set of possible examples.

The next step in constructing the spatial statistical model is to determine the probabilities for the possible states represented by the elements. Out of the many possibilities contemplated, a boundary generated by a polygonal, parametric and continuous function can help to determine the probability values. The boundary delineates between areas of the space containing elements that are likely to correspond to output sequences and those that are not. This can be done using a "curve fitting" technique, where the output of a polygonal and spline function conforms to a distribution area comprising elements that correspond to members. Constraint elements are selected where the boundary, created by the polygonal, parametric and continuous function, intersects an element of the space. Those elements are selected as constraint elements or boundaries of the positive probability subspace, which represents the state subset. Such polygonal, parametric and continuous functions can generate a variety of shapes, such as lines, polygons, parametric shapes and curves. In FIG. 6 in space 600, particularly the probability field bound by boundary 611, an output of a continuous function is shown as lower boundary 601 and upper boundary 610, which specify the positive probability subspace 602 and zero probability subspaces 603 and 604. Space 612 and its probability field outlined by boundary 613 has constraint boundary 615 that defines positive probability subspace 618 and zero probability subspace 614. For space 612, the positive probability subspace reaches all the way to the x axis and takes more area of the probability field than positive probability subspace 602 in space 600.

Out of the many possibilities contemplated, the curve fitting algorithm may begin with a line segment, where the first endpoint has a value of (256, 0) on they and x axis respectively. The second endpoint of the line has a coordinate value greater than 4080 on the y axis and 15 on the x axis. This line segment is an upper boundary constraint that is given a y value that places the line segment in a region where no members correspond to elements. Iteratively, the process changes the shape of the boundary by lessening the argument values of the line function. It then checks if the line hits any element/point that corresponds to any member of the output sequences. If it does not, the process repeats. If it does, the process stops and the argument values for the function are constructed. This same process is completed for a lower boundary, where the coordinates (the argument values) of the endpoints are (0, 0) and (0, 16), y and x axis respectively. The iterations continue, the argument value increasing after each intersection check, until the line hits an element/point that corresponds to a member. One of ordinary skill in the art of "curve fitting" may use other known methods, such as math functions that fit the continuous function to the distribution of the corresponding members. The aim is to match, as closely as possible, the output of the continuous function to the shape of the distribution of the members based on their correspondence to the elements. The argument values may be used by the polygonal, curve and parametric function to determine the probabilities of the states without going through the steps of the "curve fitting" algorithm.

Inside the positive probability subspace, defined by the constraint elements, each point is determined to have equal probability values. All points outside the constraints have a probability value of 0. While the probability values can be assigned to every possible state represented by an element, there is no need in this present example, for the constraints are used in an enumeration calculation that outputs a number of probable sequences within the positive probability subspace. The constraint elements limit the ranges the possible states of a member can be. The enumeration calculation counts only the output sequences within the boundary and thus innately determines the number of sequences that have a probability greater than 0 by counting only the sequences within the positive probability subspace, making any state beyond the constraint impossible and therefore uncounted. The enumeration calculation is described in subsequent paragraphs. It should be noted that points "inside" or "outside" the boundary may be reversed if desired, where points outside the boundary are determined to have probabilities greater than 0, and points inside the boundary are determined to have probabilities of 0.

Once the probability constraints are selected, they can form the constraints of a model, or they can be compared with other models previously stored in a storage medium. If the constraints fit those known models, the data may be considered to match that model. For example, if a set of output sequences are analyzed in a space using the constraints described above, and those constraints fit inside or match the constraints of a previously recorded statistical model for random-like data, then the model being tested will be determined as a random-like data model. Likewise, the present method, article comprising machine instructions, and apparatus may test the state of a data system by determining whether or not its shape fits in the boundaries of a previously recorded model. Said test is described in the following section.

The model for random-like data in this first example specifies the constraint elements at the $15^{th}$ interval of the output sequences as, (15, 3,430) and (15,600), x and y respectively. In FIG. 6, space 600 shows upper bound constraints 606, and lower bound constraints 607, which are aligned with upper boundary 610 and lower boundary 601. For space 612, upper bound constraint 617 has a higher state value of 3500 and has no lower bound constraints. For the members at the 15th interval of space 600, the upper and lower bound probability constraints are at the following x and y values, (14, 3,260) and (14,500) respectively. The constraint elements may continue until x is 0, the first interval. With the argument values constructed, the probability values for the possible states represented by the elements in the space determined, the spatial statistical model for random-like data is now established and can be stored in a storage medium for future processing. The probabilities of the systemic characteristics represented by the probability field form the basis of the spatial statistical model, whereby its argument values can be passed to the function that aided their construction.

In this example, the spatial model described previously is used to lower the average maximal entropy of 128 bits for a random-like data sequence of 16 bytes. To accomplish this, the system constructs an ordered list of identifiers based, in part, on the state subset of the data system. In the present example, these identifiers describe the members using a unique sequence number that encodes the state value of each member of an output sequence as a radix using a positional notation. In this example, the identifiers are based on an enumeration calculation, which calculates the total number of output sequences (or states) within the positive probability subspace (or state subset), which is defined by the constraint elements described previously. The same positional notation may then be used by a decoder to generate the 16 byte sequence represented by the identifiers.

Matching Data

To lower the average entropy of 16 bytes of random-like data using the spatial statistical model, the data processor first receives the data system comprising 16 bytes intended to be encoded. The system initiates the same sequence function described previously, which processes the ordered sequence (the data system) and outputs the monotonic output sequence.

The system must then determine the state subset for the data system. To do this at this stage, a matching test can be performed to determine if the output sequence is similar to the systemic characteristics of a known spatial model for random-like data. A space is constructed, where the output sequence corresponds to the elements.

From the many possibilities contemplated, this test may be accomplished using an intersection test, where the elements of the space corresponding to the output sequence are tested by the data processor to determine whether or not the output sequence matches or resides within the positive probability space of the random-like spatial model. If the members test positive for matching or residing within the positive probability space of the random-like spatial model, then that model is applied to the output sequence to encode it. If not, the output sequence can be tested with other spatial statistical models stored in computer memory or storage device, until a match is made.

The test may be efficient due to the fact that only elements corresponding to the output sequence and within the boundary of the model would be tested. There may be a binary test, where elements within the positive subspace of the spatial model are assigned a value of 1, where all other elements are assigned a value of 0. The structure and number of elements of the space corresponding to the output sequence and the spatial model would be identical. The intersection test can be a straightforward algorithm that reads the elements in the space corresponding to the output sequence and tests whether those same elements in the spatial model have a value of 1. If the elements being tested correspond with the same elements of the model, the data system or output sequence being tested will be considered as fitting the model. This test is similar to the methods using collision detection and voxels, as in U.S. Pat. No. 8,279,227 to Cohen titled "Method for detecting collisions among large numbers of particles" filed Apr. 28, 2008. This form of pattern recognition can be used for a variety systemic characteristics. Such an algorithm given in the present example may not be considered as a limitation to matching known systemic characteristics of data to a known model or other data.

When a match is made, the constraint elements from the matching spatial model are received as argument values by the data processor and passed to an enumeration calculation function.

Ordered List of Identifiers

The next step is to encode the members using a positional notation that implements an enumeration calculation, which determines the total number of probable sequences that obey the model's constraints. While the system could iteratively count and test each probable sequence to see if it obeys said probability constraints, this would be very computationally expensive, even though such a technique can be used and therefore falls within the scope of this method, article comprising machine instructions, and apparatus. In the present embodiment, the principle of Inclusion-Exclusion (P.I.E. or inclusion-exclusion) is utilized to determine the number of states within the boundary of the state subset or the positive probability subspace. The formula for the P.I.E. is as follows:

$$|\cup_{i=1}^{n} A_i| = \Sigma_{k=1}^{n}(-1)^{k+1}(\Sigma_{1 \leq i_1 < \ldots < i_k \leq n} |A_{i_1} \cap \ldots \cap A_{i_k}|)$$

A simple example of how to use inclusion-exclusion to enumerate all possible monotonic sequences that sum to a value of 4080 is described in the following paragraphs. Algorithmically, the formula may be expressed using the following steps.

The total number of probable output sequences is calculated using the binomial coefficient $$\binom{n}{k},$$

where n is a total number of possible elements to choose from, such as a total value that all 16 members in a sequence add up to (i.e. 4,080), while k is the number of selected elements, which in this case, is the length of the sequence minus one. The number of elements between each of the 15 selected elements indicates the state value of a member. The algorithm calculates all the possible ways that n can be divided by k. An example would be the following: n=4095 and k=15, which gives the total number of possible output sequences comprising 16 members that sum to 4,080.

If there were no limits on what the state value could be, such as a state value between 0-4080, then the solution would be the non-negative numbers to a total, such as: (m1+m1+m3+ . . . m16)=4080. However, because each member can only have a value between 0-255, the process must discard the solutions with m1≥256, which is m1−256≥0, or m1*=m1−256; where (m1*+m1+m3+ . . . m16)=3824. The number of probable sequences meeting this first condition is calculated using the binomial coefficient, $\binom{3839}{15}$.

The first operation subtracts the number $\binom{3839}{15}$ from $\binom{4095}{15}$ 16 times, once for each member, which results in the total number of all sequences meeting the first condition. Using the principle of inclusion-exclusion, this first set of calculations in the series of calculations over counts the number of probable sequences subtracted, for it included sequences that did not meet all the conditions for each member. It must add back the total number of possible sequences where two pairs of members with a value between 0-255 are considered. This is calculated in the second set of calculations, such as (m1*+m2*+m3+ . . . m16)=3568, where m1 and m2 are paired. The next set of enumeration calculations in the series subtracts the total number of probable sequences where three pairs of members with values between 0-255 are considered. This multiple set of calculations repeats, alternating between sets of addition and subtraction, to and from $\binom{4095}{15}$, each time increasing the number of members considered with values between 0-255, until a final number results, which is the number of all probable sequences that sum to 4080.

Taking the inclusion-exclusion technique further, all probable sequences that sum from the range of 600-3430 can be determined, which is between the constraints at the 15$^{th}$ interval on the x axis. To do this, the processor must perform the enumeration calculation described above for all output sequences that have a sum value between 600-3,430. For example, the method begins calculating the number of probable sequences with 16 members summing to 3,430. The process stores this number in computer memory, decrements the total to 3,429, starts a new enumeration calculation, then adds the resulting number to the final tally. It continues until the last sum is 600, at which point the iteration stops. The result is the total number of probable sequences where their totals are within the range of 600-3430, as determined by the constraints, which in this example equals 3.402822×10$^{38}$.

Among the possibilities contemplated, a total number of output sequences obeying the constraint at the 15$^{th}$ interval can be reduced when the other constraints along the x axis are also used to eliminate non-probable sequences. Based on the constraint selected at the 14$^{th}$ interval on the x axis, the range is 500-3260. Any sequence that sums to 3320 cannot have their 14$^{th}$ member go beyond the y value of 3200. Because those output sequences were included in the enumeration calculation described above, the method can subtract those sequences from the final number. This is calculated by finding the number of sequences where the 15th member has a state value within the range of 3261-3430 and 0-499, yet where the 16$^{th}$ member has a state value also within range of 500-3260. Using the inclusion-exclusion method, the number for these output sequences is: 2.481976×10$^{31}$. This subtraction may continue for the next constraints at the 14th interval.

To calculate the measure of the entropy for a random sequence of 16 bytes, using the spatial probability model as described previously, one can use the formula: $\log_2 n$, where n is the total number of probable sequences.

Based on this equation, the information entropy of a random-like 16 byte sequence using the statistical model for random-like data, as presented in this example, is 127.9999996 bits on average. This is less than the maximum entropy of 128 for a 16 byte message without using the model.

To encode the members of the 16-byte sequence, the method or apparatus uses the same inclusion-exclusion enumerative calculation to encode a unique sequence number from 1-3.402822×10$^{38}$ using the positional notation. The number is stored as part of the encoded message of the ordered list of identifiers using bit fields.

A variety of positional notation systems exist in the known art, such as mixed radix and non-standard positional notations. Arithmetic coding is a popular method in the known art that also uses a numeral system. Out of the many possibilities contemplated, a possible algorithm to encode the unique sequence number using positional notation is described below.

Each member of the output sequence is represented by a radix of the positional notation. The positional notation algorithm must match the values of each radix to the values of the members of the output sequence, whereby a final sequence number is encoded, which represents the state comprised by the state subset. The range of each radix value is determined by the range of possible states for the members set by the constraint elements. The process of encoding the sequence number begins with the first member in the sequence.

Figure 7:
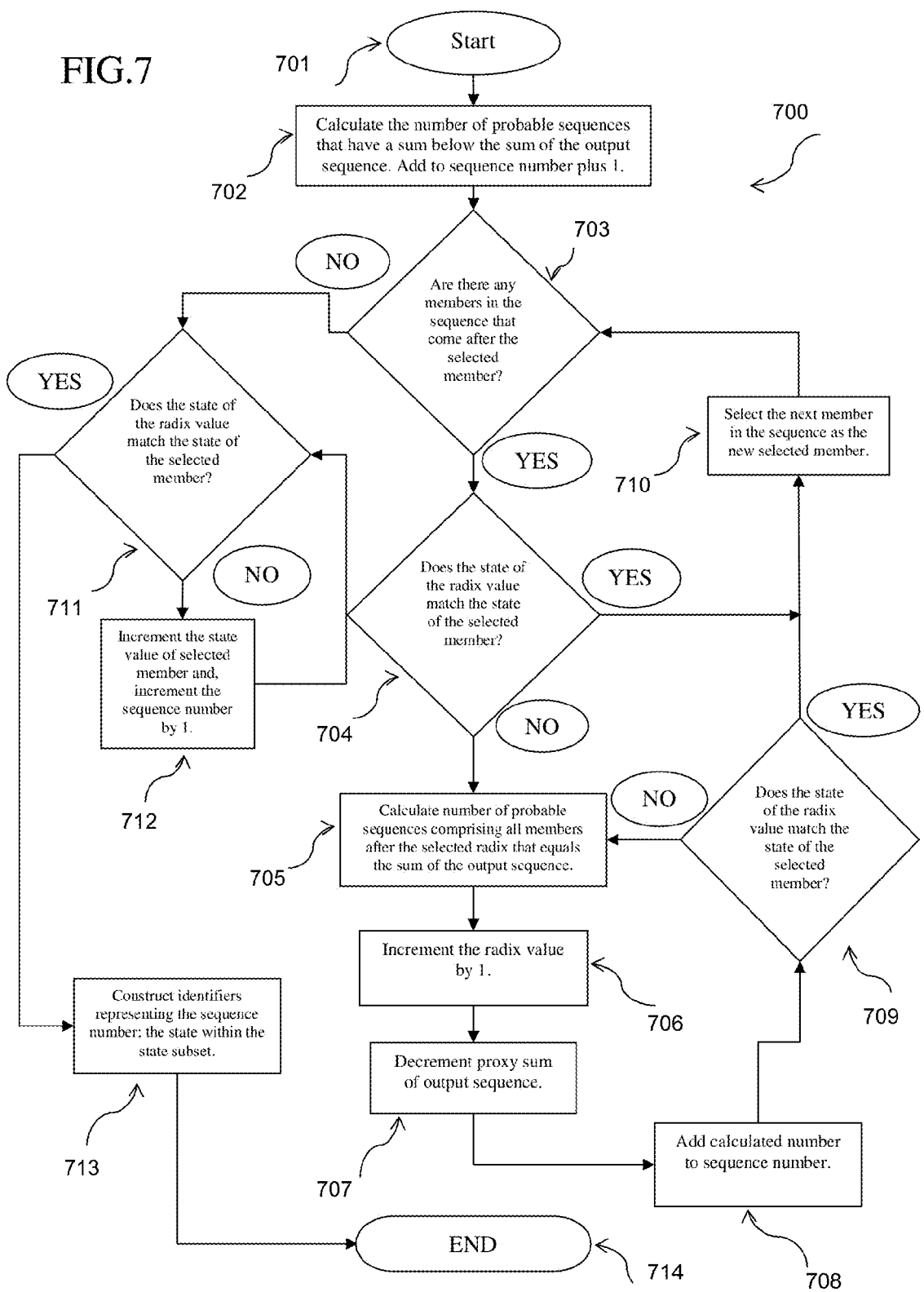
FIG. 7 is a flowchart outlining an exemplary operation of constructing an ordered list of identifiers using a positional notation, according to the present inventive subject matter.

As shown in FIG. 7, flowchart 700, because the order of the probable sequences starts with 1, the encoding process must calculate the number of probable sequences that sum to a value that is above the lowest constraint or sum, and below the sum of the output sequence, step 702. This number is added to the sequence number, for the current output sequence is ordered above the other output sequences with a lessor sum. For example, if the sum of the output sequence is 2040, and the lowest sum is 600 at the 15$^{th}$ interval on x, then the number of all probable sequences with a sum from 600 up to 2039 would be determined and added to the sequence number.

The algorithm now checks whether there are any members following the currently evaluated member in the output sequence, step 703. If true, the process continues, step 704. Because the first member generally is followed by others, this would be usually true at this stage.

At step 704, the algorithm compares the radix value to the actual state value of the currently evaluated member. If the radix value is not equal to the state value of the member, the algorithm proceeds to step 705, where an enumeration calculation commences, which determines the number of probable output sequences comprising all subsequent members which add up to the sum of the output sequence. The radix value is then incremented by 1, step 706. The algorithm then decrements a "proxy" sum of the output sequence, steps 707, which will then be used in subsequent enumeration calculations to encode the current radix value. This result of the enumeration calculation is added to the sequence number, step 708, which will ultimately result in becoming the uniquely encoded sequence number.

The next step tests whether the state value for the currently evaluate member equals this incremented radix value in step 709. If the two values are equal, the process moves to the next member in the sequence, step 710, and repeats said steps from step 703, whereby the number of members to calculate for goes down to 14. If the radix value and the actual value for the currently evaluated member do not equal, another enumeration calculation begins, step 705, which calculates the number of probable output sequences having 15 members that obey the constraints and proxy sum, and adds the number to the final sequence number, step 708. It then continues with step 709, checking if the radix value and the member equal. This process repeats for all the members of the output sequence until the last member is reached. The process tests the last radix value, step 711, and increments this radix, step 712, until its value matches the real member's state value. The ordered list of identifiers is constructed to represent the sequence number, step 713. The result is a uniquely encoded sequence number that describes the state values of each member of the output sequence, step 714, signaling the end of the algorithm.

For this present first example embodiment, the following may be included in the list of identifiers:
1. Symbol Set criteria (if required).
2. Size of the data system.
3. The argument values for the continuous functions or a 1-bit signal confirming whether the data matches a predetermined model, such as pseudo-random/random-like data system.
4. The sequence number describing the state comprised by the state subset (members of the output sequence that are within the positive probability subspace).

If the symbol set is not known (not included in the decompressor) then it is required to include that information with the ordered list of identifiers. This is usually not required for random-like data, as all the 8-bit symbols have relatively equal frequency of occurring along the data system. One of ordinary skill in the art may understand that a decoder may also have default values for certain identifiers and not require them to be part of the encoded message. For example, the defaults for the symbol criteria may be 8 bits, the size of a message being 16 bytes, and the argument values satisfying the constraints for pseudo-random/random data.

Generating a State Within the State Subset

The sequence number is decoded by reversing the algorithm of the positional notation system used to encode the members of the original output sequence. The decoder must receive the ordered list of identifiers and the argument values of the model for the random-like state subset type to generate the data system. In this example, the spatial model uses the constraints determined for a random-like data system, which are passed as argument values to the function that selects the constraint elements; its output intersecting elements in the space representing the boundary of the state subset. This is done for the lower and upper boundaries as described previously using a line segment.

The process then calculates the total number of output sequences within the positive probability subspace using the enumeration calculation as previously described. Calculating this number enables the present method, article comprising machine instructions, and apparatus to read the correct number of bits required to describe the unique sequence number, which is between 0 and the total number of output sequences obeying the model. Finding the correct number of bits can be solved using $\log_2 n$. When the identifiers representing the sequence number are received, the decoding of the output sequence may begin.

The next step is to determine the approximate sum of the encoded output sequence. This may be accomplished by determining the number of probable output sequences, which sum within the range established by the model. This number is added to a final tally, where it is compared with the sequence number. The comparison test is done by the data processor to determine if the sequence number is greater than the final tally. If yes, the data processor continues with incrementing the sum to be used in another enumeration calculation and proceeds with a new comparison test. If the sequence number is less than the final tally, it is an indication that the sum of the encoded output sequence is less than the currently evaluated sum, but greater than the previously evaluated sum.

The data process then proceeds to decode the sequence number by performing the same positional notation described previously, starting with the first member. The process compares the calculated number with the unique sequence number read. If it is less than the read sequence number, the process iterates; it increments the state value of the member being generated, starts a new enumeration calculation and adds that calculated number to the final total. If the calculated number is greater than the read sequence number, the process stops and marks the member being generated as a match. The process records this member's state value as the value for the first member of the output sequence. The process advances to the next member in the sequence and repeats said calculation, incrementing, testing and matching. The result is the decoding of the original output sequence. Once the generated sequence is decoded, the data processor applies the inverse of the sequence function to the generated sequence.

Possible Embodiments

Figure 8:
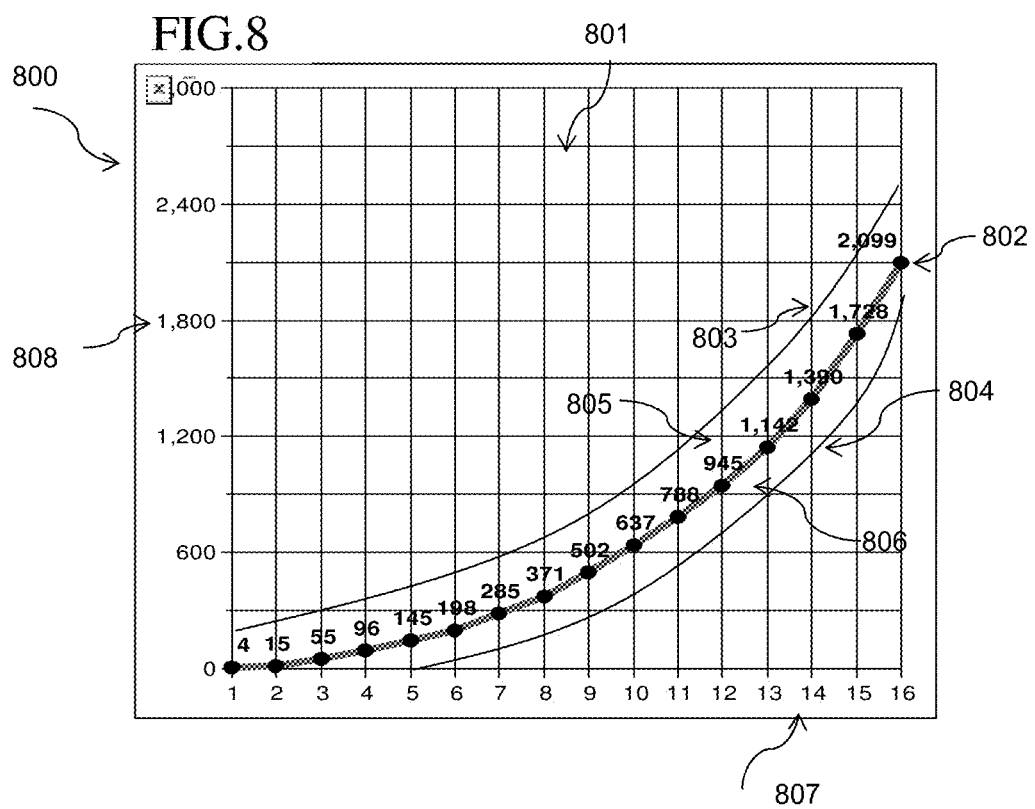
FIG. 8 is an exemplary graphic chart displaying members of an output sequence corresponding to elements of a set with added structure or a space, according to the present inventive subject matter.

Many variations to the steps described above are possible. For example, the argument values for the continuous functions are generally not required to be included with the ordered list of identifiers for random-like data as presented in this first example, for the spatial model of a random-like data system can be included with the decoder, since the statistics of random-like data is generally uniform for all states in the state subset, unlike ordered data, which has a spatial characteristic that varies across ordered-like states. Where argument values can be useful is when the choice of modeling a smaller area of the positive probability subspace is applied. In particular, this is when the total number of bits required describing the argument values, the function receiving the argument values, and the ordered list of identifiers representing the sequence number is less than the option to encode only the sequence number within a much broader positive probability subspace included with the decompressor. In that scenario, it may be beneficial to include the continuous function and its argument values with the list of identifiers. For example, when the two line or curve boundaries comprising the positive probability subspace creates a much narrower channel, as the positive probability subspace would contain far fewer sequences, resulting in a smaller sequence number. FIG. 8, in chart 800, shows output sequence 802, enclosed in a narrow channel by continuous curve 803 and 804, which represent boundaries to the positive probability subspace 805 and 806 within space 801 of two dimensions; axis x 807 and axis y 808. This model describes a much smaller number of probable output sequences within the positive probability subspace.

Another possible technique for the selection of constraint elements would be to define the positive probability subspace by selecting constraint elements within the space discretely. By traversing all member state values for each output sequence read and comparing each along the time axis (x), the highest and lowest state values at each interval on the x axis can be used. These values may act as constraints.

In another embodiment, the selected probability constraints can be embedded in the source code or hardware processor of the decompressor itself and the compressed code simply contains an argument value that identifies whether it is a random type data or not. In that embodiment, the argument values of the function need not be included with the encoded message, only a "yes" or "no" to confirm whether it fits the criteria of a given statistics model.

A number of states within a state subset may also be calculated and stored in an a priori generated set or index. In such an embodiment, the encoder/decoder need not enumerate the number of states within a subset when encoding the sequence number using the positional notation, as described previously. It would simply look up the number of probable output sequences in the a priori generated set to encode/decode the sequence number.

In yet a different embodiment, a deviation from the known model can be included in the encoded message, whereby a standard constraint set is included with the decoder and a deformation value, included with the identifiers, defines a difference between a known or current argument value and a different or previous argument. If deformation values are included with the identifiers, the system will receive them to offset the standard argument values or previous argument values of the spatial model to determine the probability values of any possible state of the systemic characteristic. Due to the fact that different models would all have the same topology, a continuous function may deform the standard models to approximate a single sequence or a set of sequences.

Any method or apparatus that selects a set of one or more probability constraints for an enumeration calculation, whereby the constraints are fitted tightly or loosely to an area where a probability distribution of members exist in a structured set or space, and where that area is less than the total space, is within the scope of this inventive material. This includes a smooth function that fits the points of another smooth function and boundary area, which in turn fits another distribution of members. As subdivision surfaces is used in computer graphics, so too can the shape of the boundary be subdivided to provide improvements in the speed of encoding/decoding the output sequence and sequence number. In that embodiment, a lower resolution sequence is refined through higher and higher subdivisions until the shape of the sequence matches the output sequence at the highest resolution, essentially using a hierarchal multi-resolution structure to the space comprising the output sequences. Such methods that may be used for defining the shape of the data system, output sequence and probability distributions are; continuous functions, splines of various kinds, multi-level subdivision geometry, rays, line segments or polygons defined by discrete points using interpolation to smooth the in-between spaces. A continuous function is not required to generate a set of constraints. It can, however, be considered an advantage.

The benefit of using a continuous function rather than a more discrete selection technique is that the data required to generate the constraints for all members corresponding to elements/points in a space is lessened when using interpolation. Thus, continuous models can be generated using less data to define them, rather than if the shape was defined discretely. A continuous function can describe the essential form of the data system represented within a space, which allows the structure of a data system to be independent from the resolution of the set. A "sufficiently" smooth shape would mean that the probability of the systemic characteristic determined by the continuous function represents an infinitely smooth output in comparison to the more discrete space defined by elements. For example, a spline may create a smooth, interpolated curve with only a few points, when a system can take the control points and generate the smooth curve. Therefore, the number of elements required to describe a form of the state subset boundary can be less when using smooth, continuous functions. The continuous function need not have control points, but any argument value that may allow it to generate its output.

Regarding the step of calculating the number of probable output sequences within the positive probability subspace, the use of inclusion/exclusion does not limit the scope of the inventive subject matter. Other methods to determine the number of states within the state subset may be used. Algorithms or functions for calculating the total number of sequences contained by said constraints may be found in the known art and be the following; Dynamic programming, Generating Functions, Summation Functions, Enumeration functions and Standard Deviation functions.

A dynamic programming function may be as follows:

With nonnegative integers $Q_j$, $j=1 \ldots n$, let $F(y,q)$ be the number of solutions of $x_1+ \ldots +x_q=y$ with $x_j \in \{0, \ldots, Q_j\}$ for each $j$. Then $F(y, 1)=1$ for $y=0,1, \ldots Q_1$, 0 for $y>Q_1$, and $F(y,q+1)=\Sigma_{min(y,Q_{q+1})x=0}F(y-x,q)$.

A generating function may be the following:
$(1+x+ \ldots +x^{constraint\_a})(1+x+ \ldots +x^{constraint\_b})(1+x+ \ldots +x^{constraint\_c})(1+x+ \ldots +x^{constraint\_d}) \ldots$, where the generating function is able to calculate the number of possible sequences given the constraints, which is the exponent of x.

A summation function may be the following: $\Sigma_{a=highconstraint\_a} \Sigma_{b=max(a+1, lowconstraint\_b)a+highconstraint\_b} \Sigma_{c=max(b+1,lowconstraint\_c)highconstraint\_c} \Sigma_{d=max(c+1,lowconstraintd)highconstraint\_d} \cdots x$.

The summation equation sums all the possible sequences within the high and low constraints that equal a given total. This is essentially an enumeration function that counts all possible permutations of a sequence, sums the members and tests whether the total equals one of the totals within the positive probability subspace.

A standard deviation function would take the total number of all probable states within a state subset and divide that total along the confines of the normal distribution model, which is shaped like a bell curve. Thus, the first total within the normal distribution may be 1, where the members of the sequence sum up to the lowest possible total. The number of possible sequences summing to subsequent higher totals increase, matching the slope of the normal distribution until it reaches its zenith, at which point the number of possible sequences diminishes as each total at the other side of the bell curve is evaluated until the number of sequences at the highest possible total is 1. The function may determine the number of possible sequences summing to any particular total based on the normal distribution.

Another possible technique for determining the number of probable sequences obeying constraints may be by treating the space as a lattice. The constraint elements may be constraints for a monotonic lattice path. The total number of possible lattice paths is calculated using the binomial coefficient ($_x^{x+y}$) where x and y are the maximum size of the dimensions of the lattice. The first operation subtracts all of the possible monotonic paths that pass through one of each constraint. The same binomial coefficient formula is used to calculate from the constraint point to the next point in the path, which in the first series of calculations is the end point or the upper right corner of the domain. The product of these binomial coefficients equal the total number of possible monotonic paths from the origin, through the constraint point(s), to the end point of the lattice. Each of these for every constraint are summed, and then subtracted from the total number of possible paths without constraints. Using the principle of Inclusion/Exclusion, the first set of calculations over counts the number of possible lattice paths that were subtracted. It must add back the total number of possible monotonic lattice paths that pass through two pairs of constraints in the next series of calculations. This multiple series of calculations repeats, alternating from subtraction to addition of constraint sets until all combinations for the number possible monotonic paths passing through the constraints are counted. The final result is the number of monotonic paths that do not pass through the constraints.

Any method or apparatus that calculates or estimates a total number of probable states or sequences within a state subset of a data system falls within the scope of this inventive material.

As stated previously, the number of probable sequences can be reduced further using a spatial statistical model where a sequence function process an ordered sequence and outputs an output sequence where the state values of the members signify a measure of a variance from a determined value, such as the mean, median or mode of a sequence. Such is the case where a total sum for 16 members is 2032 and, dividing 2032 by 16 yields 127, which makes "127" the mean value. A measure of the ordered sequence's deviation from the value 127 can be expressed by the output sequence.

FIG. 9, in diagram 900, shows the members representing the deviation from the mean value 127, which can be accomplished by putting the members 903 in lexicographic order. The members are bounded by boundary 904, of positive probability space 905. A second monotonic sorting output sequence representing a sequence out of a total of 16! possible sequences may be employed to sort the lexicographic ordered sequence back into an unsorted sequence, as described previously. A series of monotonic sorting sequences are shown in the two dimensional space 907, using x axis 908 where the intervals are normalized from 0-100% and, with y axis 909 representing the state value from 0-130, for each sorting value is summed by the previous sorting value in the output sequence using a summation sequence function or an monotonically increasing function. The probability field is defined by boundary 911. The members of the output sequence 910 are enclosed within positive probability subspace 914, which is bounded by constraint boundaries 912 and 913. The zero probability subspaces 915 and 916 are also displayed. The number of states of each subsequent member decrements by 1 from a number of 16 possible states (i.e., 16, 15, 14, 13 . . . ), if each of the 16 members in the lexicographic ordered sequence has different state values. If two members in the lexicographic ordered sequence have the same state value, then the highest possible state a member could be would be 15 rather than 16.

The variance from the mean can be exemplified by the degree of the slope of the boundary curve in space 900. The smoother and more pronounced the slope of the boundary containing the positive probability subspace of the lexicographic ordered sequences, the greater the variance between high and low values of the output sequence. For the case of pseudo-random or random-like data, the likelihood of each member having a value of 127, as exemplified by the upper most boundary 902, or where half the members will have a state value of 0 and the other half with a state value near 255, is not probable or within the positive possibility subspace, 905. Using this technique can further reduce the number of probable sequences having a sum between the ranges of 600-3420.

Figures 10, 11:
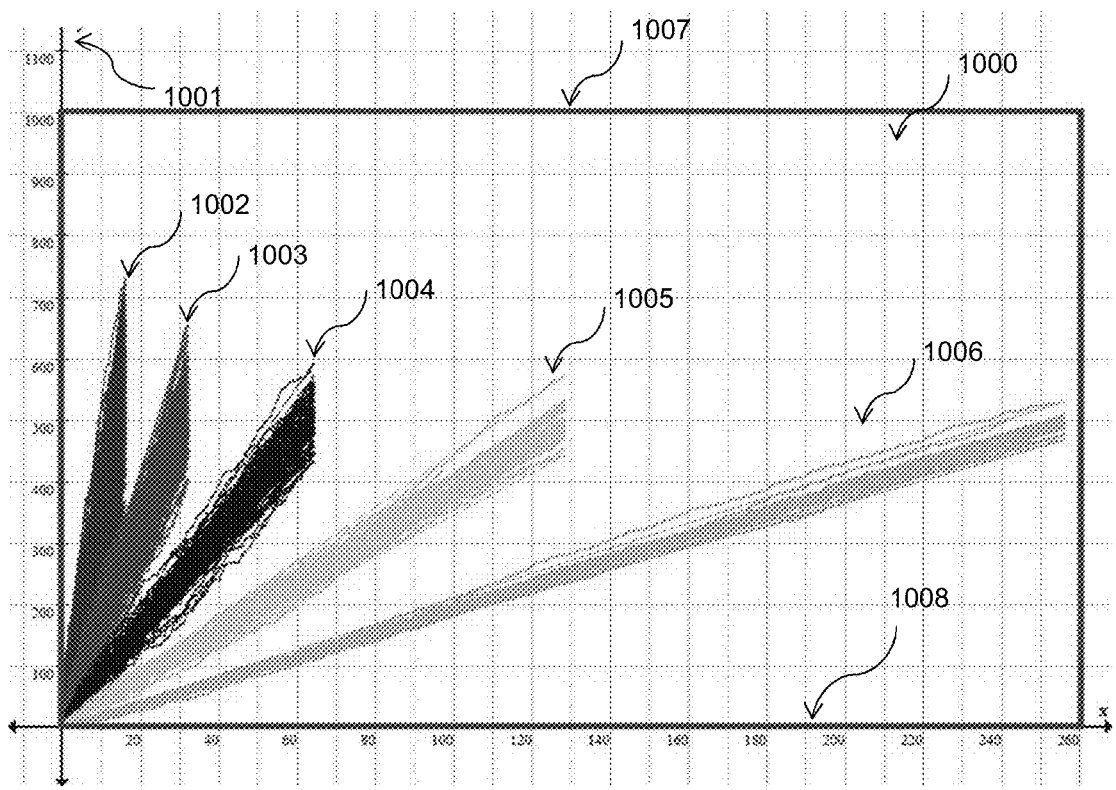
FIG. 10 is an exemplary of a graphic chart displaying sets of output sequences, whereby its members correspond to elements of a set with added structure, according to the present inventive subject matter.
FIG. 11 is an exemplary diagram of the ordered list of identifiers, according to the present inventive subject matter.

The sequences from a data system may also be modeled using various lengths, as can be shown in FIG. 10, which is a space 1000, with a normalized state dimension, y axis 1001, and a time dimension on x axis 1008. The boundary 1007 comprises the space that represents the set of all possible output sequences (or all possible states of a data system of a given length/size) where the sums of the members are normalized with a value from 0 to 1000. Each set of output sequences comes from the same data system in a state of random-like data, which is over 1,000,000 bytes in length/size. The FIG. 10 shows how the output of the sequence function is displayed in a chart, the amount of bytes it processes doubles for each set of output sequences. The first set of output sequences, 1002, is 16 bytes in length. The second set of output sequences, 1003, is 32 bytes in length. The fourth set of output sequences, 1004, is 64 bytes in length. The fifth set of output sequences, 1005, is 128 bytes in length. The sixth set of output sequences, 1006, is 256 bytes in length.

There are a wide variety of embodiments that are possible with regards to how the space is structured and how a sequence function performs; the two being a way of determining the state subset of a data system using a spatial statistical model. In addition to the way a space is structured, there are many possible sequence functions as described previously. Thus, the possibilities of using a model should be viewed to its broadest extent, for there are many ways of modeling a data system within a space. The space can conceptually have only 1 dimension, if the time dimension has no intervals. There can also be three or more state dimensions to represent a multidimensional space. The aspect of this inventive material covers any kind of set with added structure, such as Euclidean, Non Euclidean, phase and topological spaces that have at least one dimension. As stated above, there may be many types of structures and relationships that may be added to a set. Any relationship, structure and function added to a set may apply.

As stated previously, using a space is not a limitation of the inventive subject matter for determining the state subset. The state subset of a data system can also be, at least partially, determined based on any probability of a system's state and other characteristics. For example, when the probabilities of the frequencies of the states of one byte are known, as for a sequence comprising 1024 bytes, an enumeration calculation can determine a number of sequences that obey that probability distribution. For example, if the probability distribution assigns relative equal probabilities to the frequency of the 256 possible states of one byte, then using an enumeration calculation, such as the inclusion-exclusion algorithm described earlier, can determine the number of sequences comprising bytes where all its possible states appear with relative equal frequency. Using other features of the present method, set of machine instructions and apparatus, such as a probability field and constraint elements, offer greater advantages, such as a determination of a state subset's boundary, form and structure within a one or multi-dimensional space.

The next example will apply the techniques described above for the compression of a larger random-like data file.

Second Example Embodiment

The second example of the preferred embodiment will use the same spatial statistical model and argument values for random-like data described in the first example to compress two random-like files of 4,096,000,000 bytes into a single file using an iterative compression technique. It also explains how the files may be encoded and decoded using a tree data structure, which allows the method, article comprising machine instructions, and apparatus to decode only selected files without decoding all files.

All the steps described in the first example for determining a model for a data system's state subset also applies to the second example embodiment, which includes: establishing a symbol set, receiving data systems of similar systemic characteristics, accessing a sequence function that operates on the ordered sequence from the data system and generates an output sequence, constructing the space, corresponding the members of the output sequences to the elements of the space, determining probability values for the possible states represented by the elements of the space by various means, such as selecting elements as constraints. The same spatial statistical model for random-like data used in the first example is used to determine the state subset that will allow for the compression of two 4 Gbyte random-like data files. The symbol set criteria and the sequence function is identical to the first example; the data is read as a series of sequences 16 bytes long, with all 256 states of the 8-bits being considered. The description of the second example begins at the stage of constructing the ordered list of identifiers, which represent all the probable 16-byte sequences within the positive probability subspace of the spatial model.

As shown in FIG. 11, the set of possible identifiers 1100, may include the following in this present second example embodiment:
1. Symbol Set criteria 1101 (if required).
2. A state subset type 1102 (a random-like state subset type)
3. A deformation value 1103 from a previous probability distribution.
4. Size of the data system 1104.
5. The tree data structure 1105, including the number of recursion passes performed on the data (if required).

For each 4 gigabyte file in this example, a series of 256,000,000 sequence numbers must be calculated, (4,096,000,000 bytes/16 byte sequences=256,000,000 sequences). When each sequence number is represented by its own list of identifiers, the overall code becomes inefficient. This is due to the fact that sequence numbers that cannot be represented by a whole number of bits (i.e. 5.345 bits) must be rounded up to the nearest whole bit to be received by the data processor. To ensure the code is as optimal as possible, the method, article comprising machine instructions, and apparatus can create one number that represents all sequence numbers and argument values. This can be achieved using a mixed-radix positional notation system where each sequence number from the set of sequence numbers becomes the radix of a larger number. This is allowed due to the fact that the maximum ranges of the argument values and sequence numbers are known once certain aspects of the message are known and decoded first. For example, when the process knows the following; the size of the data system, the symbol set criteria and whether the data system matches a random-like data statistical model, the system is then able to determine the maximum size of the ordered list of identifiers, or the highest possible sequence number that can represent an output sequence bound by the spatial model.

To generate this mixed-radix number, the system multiplies the maximum ranges for all of the radixes preceding a selected radix, and then multiplies that product by the value of the selected radix. The result is added to a Final number. The process moves down to the next radix, repeats the same process described above, and then adds that number to the Final number. For example, Final Number=$(n \times (r1 \times r2 \times r3))+(n2 \times (r1 \times r2))+(n3 \times r1)+(n4)$, where n is the sequence number and r is the radix signified by the equations in each parenthesis.

The result is a coded number, which can be uniquely decoded using the mixed-radix positional notation. This single number, as well as the other aforementioned values that were not encoded into the mixed radix system, are added to the ordered list of identifiers.

Using the mixed-radix number system, 10,000,000 sequences with 16 members, or 1,280,000,000 bits can then be expressed using 1,279,999,996 bits or 159,999,999.5 bytes (127.9999996*10,000,000=1,279,999,996 bits) using the spatial statistical model for random-like data. The term "compressible data block" is used herein to mean a size of data that will result in data compression using the data processing and encoding techniques of this inventive material.

Data processing systems usually process information in bytes. If the compressed message cannot be represented using a whole number of bytes, as is the case for 159,999,999.5 bytes, two methods may be used out of the possibilities contemplated. First, the system can calculate a number of compressible data blocks that, when each block is appended as one data system, will result in a whole number of bytes. The method can then process that number of compressible data blocks from the data stream received by the encoder. This would result in an encoded region and a non-encoded region. The term "encoded region" or "encoded data blocks" is used herein to mean data, or compressible data blocks, encoded or compressed within the context of the techniques described in this inventive subject matter. The term "non-encoded region" is used herein to mean the bits of the original data system (or data system from a previous iteration) that did not go through the encoding/compression process in the current transformation cycle. For iterative encoding, the bits in the non-encoded region are as bits in a queue that is supplied to the encoded region when needed. A second possible method may add "buffer bits" of a quantity from 1 to 7 bits at the end of the encoded message. The term "buffer bits" is used herein to mean bits that are added at the end of the encoded message to "fill-in" for the $2^{nd}$ through $8^{th}$ bits that are vacant in the last possible byte of the non-encoded region.

Figure 12:
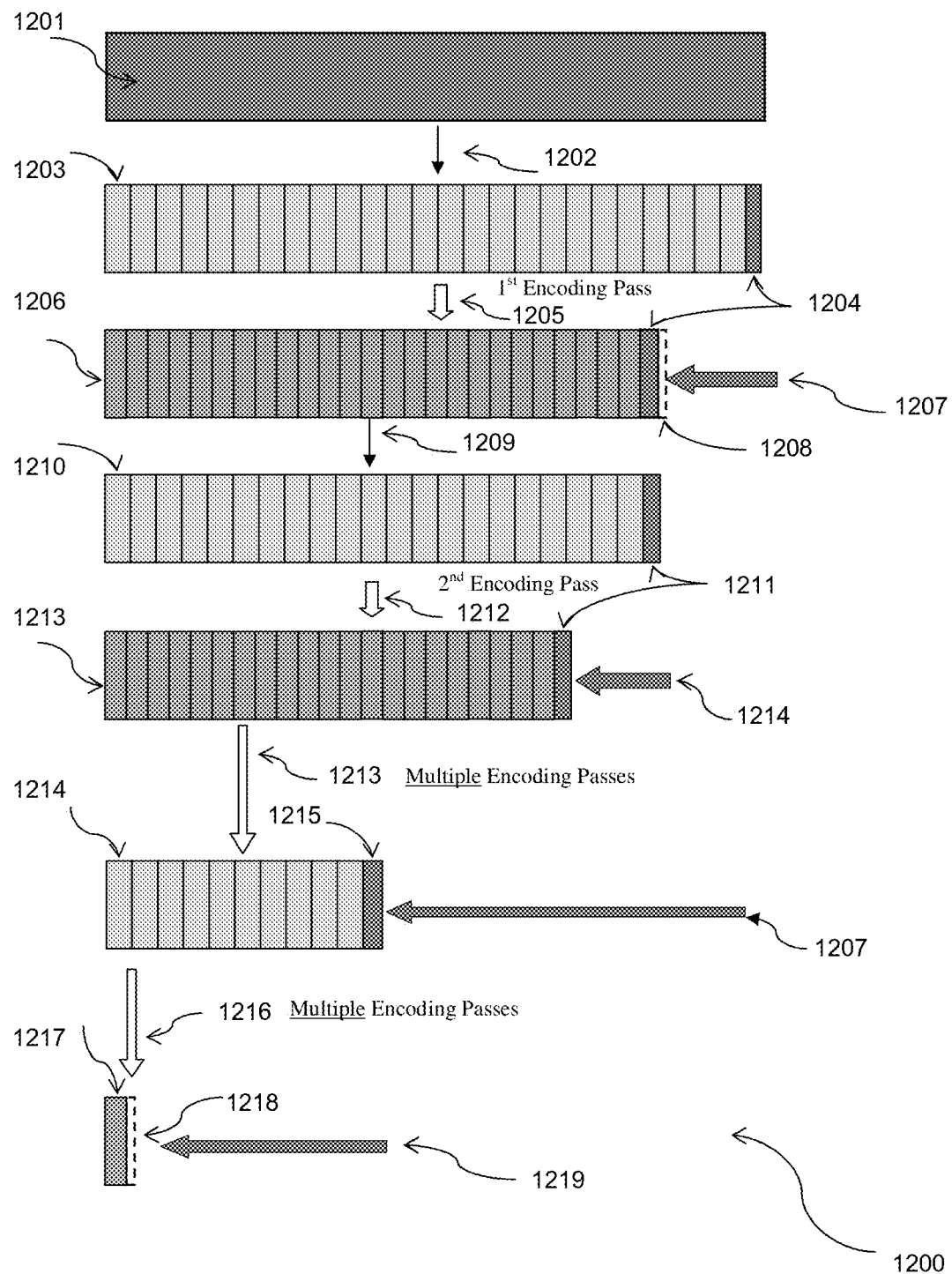
FIG. 12 is an exemplary diagram of compressible data blocks, encoding and non-encoding regions, including buffer bits, according to the present inventive subject matter.

FIG. 12 with diagram 1200 shows how this process may be applied for one of the 4 gigabyte files. The 4 gigabyte file 1201 is represented as a grey block, which is then split up into 25 compressible data blocks, such as block 1203. The process of determining these blocks is exemplified by arrow 1202. Because a limited number of compressible data blocks can fit the size of the data system or file, some of the data cannot be encoded as a compressible data block; it is therefore determined to be data within the non-encoded region 1204. The compressible data blocks are compressed, denoted by compression arrow 1207, in a $1^{st}$ encoding pass exemplified by encoding arrow 1205; the compressible data blocks become encoded data blocks 1206. The non-encoded region 1204 is appended to the last block of the set of encoded data blocks 1206. If the encoded data blocks and non-encoded region do not add up to a full number of bytes, buffer bits 1208 are appended to the end of the non-encoded region. FIG. 12 also displays how the data is processed using more than one compression cycle, which is described in the following paragraphs.

For this present example, as seen in FIG. 12, each encoded data block is appended to a preceding encoded data block. For example, the last 4 bits of the first encoded data block is filled in by the first four bits of the second encoded data block, thus a bit-wise shifting operation is required to process the data, which results in 4 buffer bits at the end of the last data block. Because a typical data processing system only reads/writes bytes, there cannot be a byte less than 8 bits. Therefore, buffer bits can be appended at the end of the encoded message if the number of bits does not add up to a whole number of bytes. If the encoded data blocks are appended in the way described above, only 4 buffer bits will be required to be appended at the last bit, giving a net compression equaling N number of compressed bits minus the number of buffer bits.

For example, 127.9999996 bits multiplied by 10,000,000 equals 1,279,999,996 bits, which is 4 bits less than 1,280,000,000 bits or 160,000,000 bytes. Therefore, a compressible data block for each random-like data file of 4,096,000,000 bytes, amounts to 160,000,000 bytes that can compress by 4 bits. There are 25.6 compressible data blocks in each 4 gigabyte file. In this second example, only full compressible data blocks are accounted for. This gives 25 full compressible data blocks, as depicted in FIG. 12 as the set of compressible data blocks 1203; each 4 Gbyte file being compressed by 100 bits or 12.5 bytes, the compressed file being 4,095,999,987.5 bytes. The result gives a total of 25 bytes being compressed out of the two files using the techniques of the present method, article comprising machine instructions, and apparatus as presented in the first and second example embodiments. The fractional data block of 0.6 for each file (12 Mbytes) is determined by the processor to be data within the non-encoded region, as depicted in FIG. 12 as dark grey blocks 1204, 1211 and 1215, which are appended to the last bit of the last encoded data block. Because 12.5 bytes have been compressed out of each file, 4 buffer bits are appended at the end of the non-encoded region to eliminate fractional bytes, netting a total of 12 bytes being compressed out of each file. This is shown in FIG. 12 as buffer bits 1208 and 1218.

One benefit to the present method or apparatus of this inventive material is the ability to iteratively compress the data if the output is also random-like data. This is possible when the same spatial model for random-like data can be applied for each transformation cycle. This is a unique advantage to using random-like data, which has a general uniform model for all random-like states. The following is a description of how to recursively apply the techniques described above.

While it may be probable that the list of identifiers generated by the method or apparatus may also embody the systemic characteristics of pseudo-random or random-like data, it is not impossible for the encoded message to also have systemic characteristics of ordered-like data. This is because the spatial model is intended to contain all possible random-like sequences, therefore all possible states within the state subset, and all possible sequence numbers representing those states, are considered equally likely. To apply compression iteratively, the systemic characteristics of the incoming data system must match the statistical model for the recursive technique, which in this case is random-like data. To ensure that this occurs, a random filter function can be applied to the bits representing the ordered list of identifiers to ensure it is random-like. This process can be accomplished by applying a XOR bit-wise operation on the bytes of the encoded message with a known data system file of the same length and in the random-like state. When the bit pattern of the random filter file is known to the decoder, the original file can be decoded by applying the inverse XOR bit-wise function using the known random filter file. This random filter file need not be included in the encoded message nor be of any significant size, as it may already be included with the decoder and applied for each transformation. Once the encoded message has been transformed to a random-like state, the process can input the transformed encoded message as a new data system to be received by the data processor, which initiates the start of new iterative transformation cycle. The process writes a number of transformation iterations performed within an index.

Iterative Encoding and Tree Data Structure

A tree data structure for the iterative encoding/decoding allows the data processor to decode selected appended files without requiring the decoding of all compressed files merged in the process, such as those belonging to the second random file. The system counts the number of recursion passes before the two files merge in the tree. A node is recorded whenever a recursion path or a data system being encoded appends another data system.

For example, each of the two random-like data files will be encoded using several recursion passes until the data can no longer be compressed efficiently due to its size, which may be a size matching a compressible data block, as depicted by the encoded data block 1217 in FIG. 12. When this occurs for the paths of each random-like data file in the tree data structure, the system can append one data file to the other, merging them as one data system, and continue the iterative encoding further. The number of iterative passes, as well as the nodes indicating when two or more data systems are appended, is recorded in the tree data structure.

When the 4 gigabyte random-like data file undergoes a second recursive encoding pass, the number of bytes for each file is reduced to 4,095,999,975 bytes. The number of whole compressible data blocks is still 25 for each file at the second iteration, reducing the data again by 100 bits or 12.5 bytes and, appending another 12 Mbytes of the file to the non-encoded region as was done in the first encoding iteration. Because 12.5 bytes were compressed out of the first and second recursion cycle, the total number of bytes compressed out equals 25 bytes for each file, allowing for the 4 buffer bits added to the file in the first pass to be eliminated. This operation is illustrate in FIG. 12, which shows the $1^{st}$ encoding pass represented by the arrow 1205 and the resulting 25 encoded data blocks 1206 that are each shown to be smaller than the compressible data blocks 1203. A new set of compressible data blocks 1210 are determined from the encoded region 1206 and non-encoded region 1208 from the 1st encoding pass 1205, all of which is considered a new data system to be received and encoded by the data processor in the second encoding pass. Multiple encoding passes may follow the second, as illustrated in FIG. 12; the multiple encoding passes arrows 1213 and 1216, along with the compression arrows 1207 and 1219 illustrating the process that compresses the data to 10 compressible data blocks 1214, along with a non-encoded region 1207, and then to only one encoded block 1217 with buffer bits 1218 appended. In this present example embodiment, iterative encoding is unable to compress data beyond the size of a compressible data block.

Figure 13:
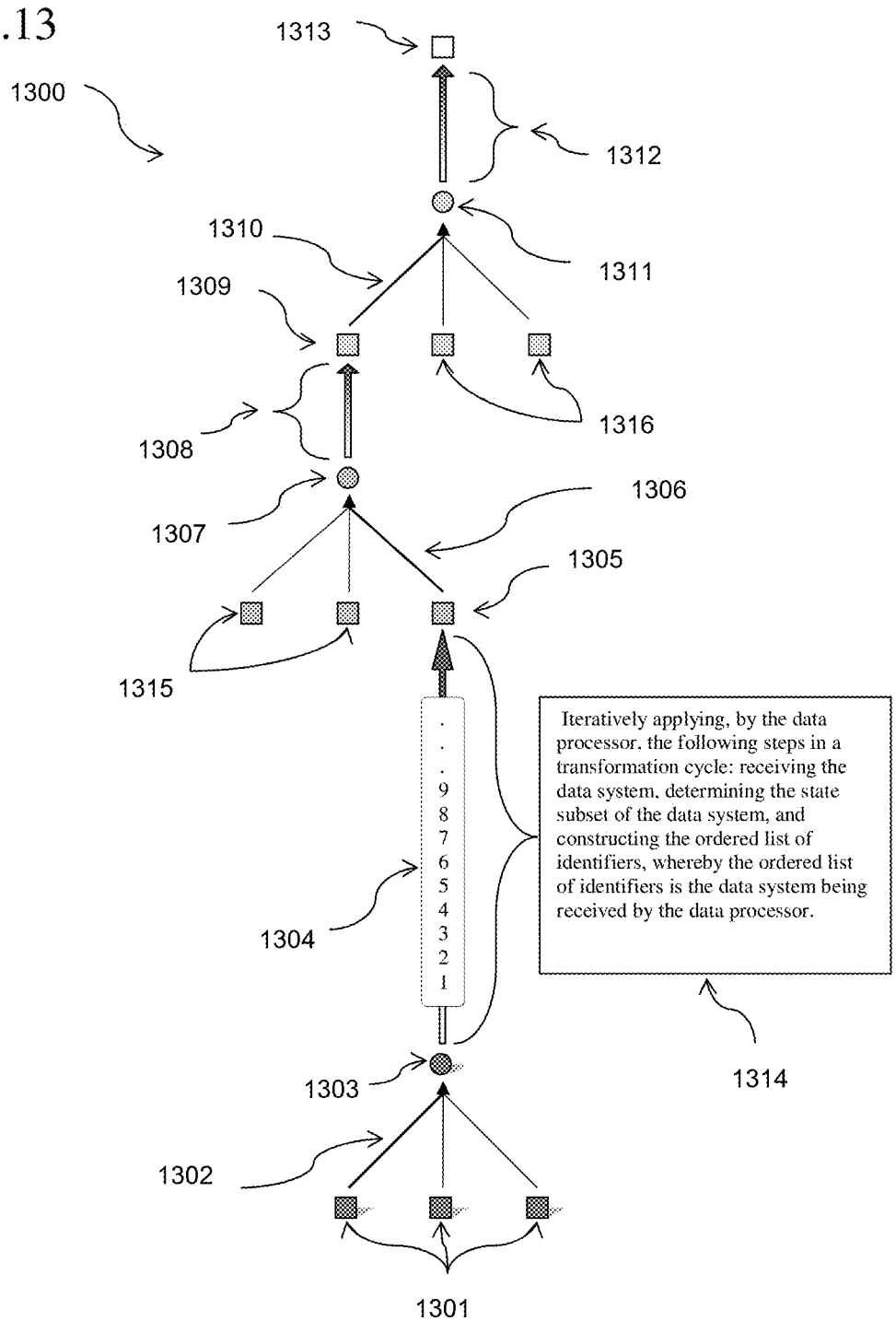
FIG. 13 is an exemplary diagram of nodes and paths of a tree data structure for iterative transformation cycles, according to the present inventive subject matter.

FIG. 13, 1300 shows how iterative transformation/encoding cycles may be constructed within a tree data structure. Three data systems 1301 are appended in an appended data system represented by node 1303. Other appended data systems up the tree are also represented by nodes 1307 and 1311. Paths 1302, 1306 and 1310 represent where data systems are appended and thus are connected to a node. A node may also mark the beginning of a series of iterative transformation/encoding cycles 1314, 1308 and 1312, where the appended data system is received by the encoding method, set of machine instructions and apparatus. A series of processes (and means for performing the series of processes) are executed in a transformation cycle, as shown in block 1314. An index 1304 is added to the tree to represent the number of occurring transformation cycles. Each time a transformation cycle is performed, the number comprised by the index is incremented. There may be a series of transformation cycles before the data system reaches a size where it may be appended with other data systems or files 1315 and 1316 into a new appended data system, which is seen in FIG. 13 as node 1303, 1307 and 1311 up the tree at branches 1302, 1306 and 1310. Using a tree data structure for iterative encoding/decoding allows the present inventive subject matter to decode parts of the data, rather than an entire set of compressed data systems of files As presented in the present example embodiment, a number of transformation iterations can increase until the compressed code is at least the size of one compressible data block. This does not include information describing the tree data structure for recursive encoding or buffer bits. The size in bytes of the tree data structure depends on the number of branches or merging of data systems during the iterative encoding and the number of iterative passes in-between those merging events or branches.

If the two random files were in a folder of a filing system, then the system would include another tree data structure, specifying the two different files, file names, file size and any other data necessary to distinguish the two files in the context of a file system of a computer operating system.

The decoding process is the same as described in the first example, which is essentially reversing the process of encoding the members using the numeral system. The difference in this example is that the process requires the decoding of the mixed-radix number and the use of a tree data structure.

The first step is to read the correct number of bits to calculate the number generated from the mixed-radix numeral system previously described. This is accomplished by receiving the spatial statistical model and calculating the maximum number of sequences in the positive probability subspace within the constraints based on the size of the data system included with the identifiers, as described in the first example. When the maximum number for the sequence numbers of each radix in the mixed number system is known, the coded number for each radix can be calculated as follows: if the maximum for each radix was 100, n can be found using the following equation: n=Final Number/((n×(r1×r2×r3))+(n2×(r1×r2))+(n3×r1)+(n4)).

Because the second encoded data block is appended at the 5th bit of the last byte of the first encoded data block, the method or apparatus will need to shift the bits using bit-wise operations in order to read the data. Among the possibilities contemplated, this can be done by reading the necessary bytes for the first encoded data block, removing the last four bits using bit-wise operations and calculating the second encoded data block from the remaining bits. The last four bits from the first encoded data block must be removed and shifted so that they are the first four bits of the second encoded data block. The last four bits of the second encoded data block are shifted at the end. Of course, the description of using bit-wise operations is not a limitation of the method or apparatus.

If a tree data structure was used in the transformation/encoding process, the generation/decoding process can access the same tree data structure included with the ordered list of identifiers to only decode selected data files/systems. This is exemplified in FIG. 14. 1400.

Figure 14:
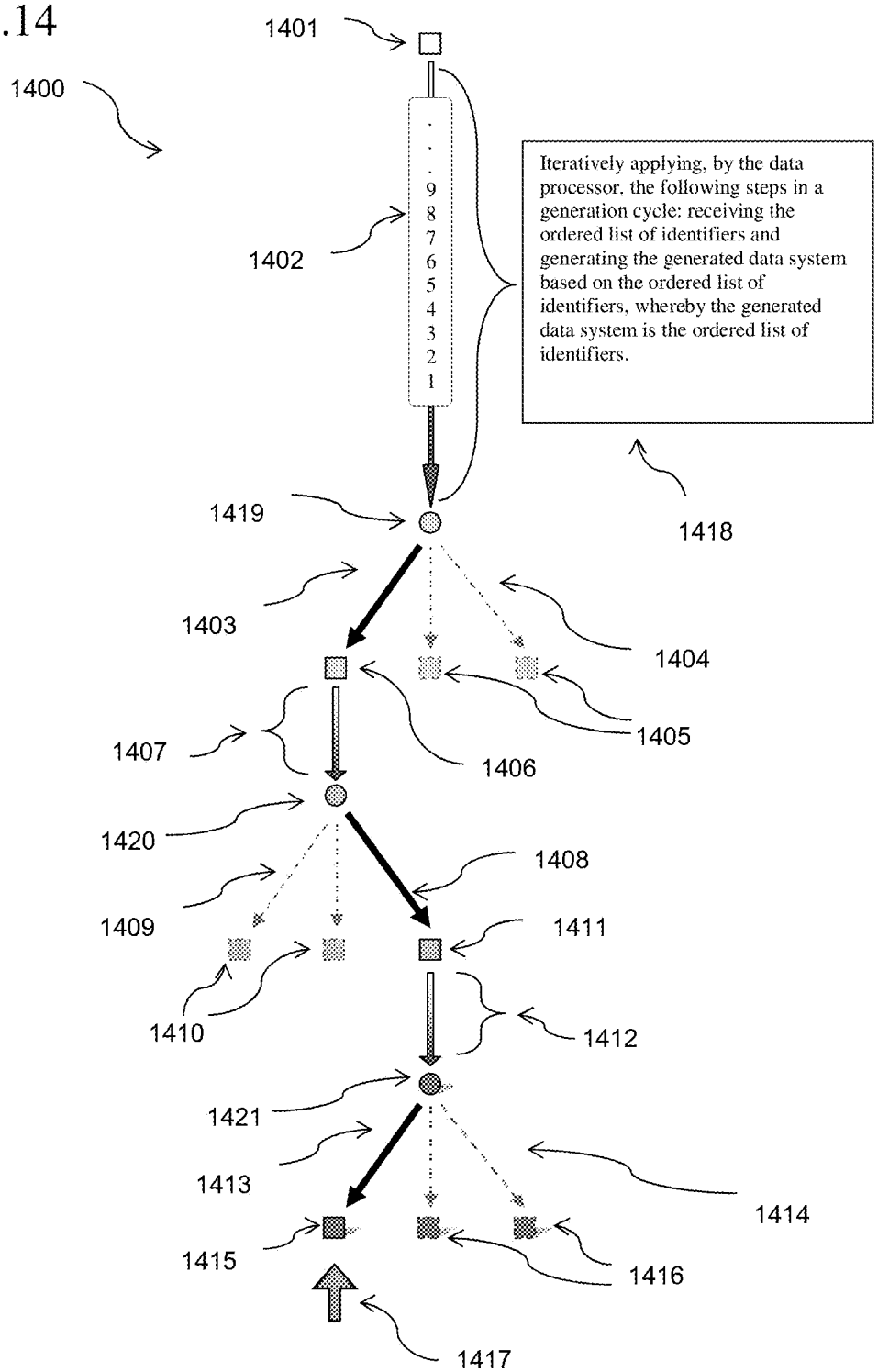
FIG. 14 is an exemplary diagram of nodes and paths of a tree data structure for iterative generation cycles using a pointer, according to the present inventive subject matter.

In order to generate/decode a selected data system transformed/encoded iteratively within a tree data structure, the data processor must first calculate a shortest path between the compressed data system or root node 1401, and the selected data system or child node 1415 selected by pointer 1417. A method in the known art for calculating the shortest path for a set of nodes can be the A*search algorithm described in Hart, P. E.; Nilsson, N. J.; Raphael, B. (1968). "A Formal Basis for the Heuristic Determination of Minimum Cost Paths". IEEE Transactions on Systems Science and Cybernetics SSC4 4 (2): 100-107. When the shortest path is determined, as seen in FIG. 14 as shortest paths 1403, 1408 and 1413, the data processor accesses only the nodes comprised by this shortest path, such as nodes 1419, 1420, and 1421, which represent the appended data system. The compressed data system 1401 may then undergo the series of generation cycles 1418 based on the index of the number of occurring generation cycles 1402 until node 1419 is accessed. The data processor may then separate the appended data system into separated data system or file 1406 and 1405. All separated data systems are attached to a node by a path, such as paths 1403, 1404, 1408, 1409, 1413 and 1414. The system may delete separated data system 1405, 1410 and 1416 not attached to the shortest path. Deleting separated data systems 1405, 1410 and 1416 can save data processing system's memory and storage resources when iterative decoding is implemented using a tree data structure. The data processor repeats the procedure for the next data system 1406 and 1411 down the tree. They too undergo the same process for the series of generation cycles 1407 and 1412 until data system 1415 is decoded. The tree data structure allows a data system selected within the tree to be decoded without decoding all data systems 1405, 1410, 1416 and the many others.

Among the possibilities contemplated, the above embodiment may be expressed using various approaches. For example, in another embodiment, rather than the data elements signifying raw bytes in a data system, a technique can signify the data elements as frequency counts and time markers along the length of an ordered sequence from the data system based on 8-bit byte patterns. The term "Frequency count" is used herein to mean a value that describes the number of times a data unit, a byte in this case, occurs along a sequence of ordered data units. The term "Time marker" is used herein to mean a value that describes the number of data units, or bytes, that occur before or after a distinctive data unit, such as a chosen 8-bit pattern. For example, if the distinctive data unit was the byte "8", a time marker value of "80" would describe "8" appearing on the 80th element in a data system.

The method or apparatus can read the incoming data stream in chunks of 4096 bytes and count the number of times each possible byte appears. These frequency counts can be plotted in a space where each possible symbol corresponds to a unit along the x axis, for example, from 0-255 for 8-bit patterns. For the y axis, each unit signifies a frequency count. For example, if byte "0" occurred 13 times, the first member would be assigned the value of (0,13) x,y respectively. A monotonic path would result in the sum of all members adding to 4096. The members may also be sorted in lexicographic order.

The time markers can be plotted in the space as follows; the x component signifies the time dimension or the number of symbols along the data sequence from 0-4096; the y component signifies the time marker value or where a particular symbol occurs along the sequence of bytes. The "time marker" members can also use a sequence function to sort it in lexicographic order. The argument values of a sorting sequence function can be passed to the inverse of the sorting function to sort the lexicographic ordered sequence back to its original ordered sequence, whereby the states of the argument values are plotted in a different space. Spatial probability models would be determined for the sequence of argument values as exemplified in the first example that was previously described. Probabilities would be determined using constraints and/or probability distribution functions. Constraints can be used in the calculation that enumerates all the sequences within the positive probability subspace. Variable-length encoding can also be employed with a probability mapping or probability distribution function.

To decode the message, the data processing would read the sequence numbers, which are the frequency counts, the time markers and the argument values for the sorting function using the techniques previously discussed in the first example. Knowing the frequency count for a specific byte symbol and the respective time markers allows the method/apparatus to write the correct number of bytes at the correct location along the sequence of 4096 bytes. This can be done for each byte symbol.

This example is to show an alternate way of utilizing the techniques presented in the inventive subject matter, showing how they may be applied using a variety of techniques, such as using different symbol sets and criteria, sequence functions, and various kinds of spaces of one or more dimensions for data processing. The methods presented in the first and second example embodiments cannot be limited to a type of data, symbol set, sequence function, enumeration calculation, variable-length encoding method, and space.

Third Example Embodiment

The third example describes a way to use a probability distribution function and a probability mapping function to determine probabilities for states within the probability field, as well as incorporating variable-length codes into the ordered list of identifiers.

The steps for constructing the spatial statistical model described in the first and second examples also applies in this third example; a data system is received by the data processor, the sequence function receives an ordered sequence from the data system and the output sequence is generated, the space is constructed where the members of the output sequence correspond to the elements of the space and the distribution of the members in the space are fitted by probability constraints. To determine the probability values more accurately for the spatial statistical model, the process determines a continuous gradient function that maps a smooth, continuous distribution of probabilities to the probability field comprising state representations or elements, particularly within the positive probability subspace.

Figure 15:
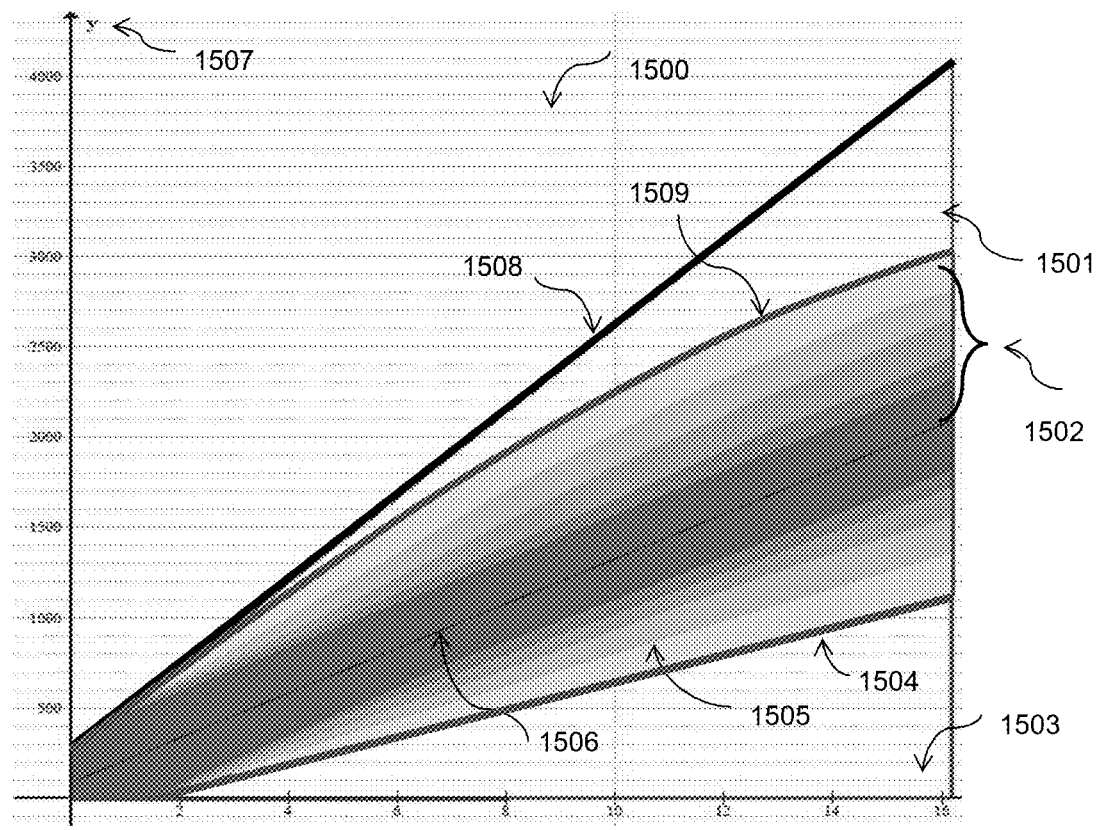
FIG. 15 is an exemplary graphic chart displaying a distribution of members within a set with added structure or a space using a probability distribution gradient function, according to the present inventive subject matter.

A variety of techniques in the known art for generating a gradient can be applied to the elements of the space. A process can iteratively compare the output of a continuous gradient function generated within the positive probability subspace, based on the probability values of the possible states. For example, a continuous gradient function is exemplified in FIG. 15, where space 1500 has an x axis, 1503, and a y axis, 1507. The boundary 1508 contains the probability field. The constraint boundary 1504 and 1509 contains the positive probability subspace 1505 where members of the output sequences correspond to elements. The gradient 1502, generated by a probability distribution function, is contained in positive probability subspace 1505, where line 1506 represents the mean of all output sequences, which is used to determine the beginning of the gradient as it spreads out toward constraint boundaries 1504 and 1509. A continuous probability distribution function generates a smooth gradient based on the number of correspondences of the output sequences with the elements of the space.

The method iterates through the high and low values of its argument values that controls the falloff of the gradient and checks the output of the function at each iteration for a "best fit" output that most effectively approximates the probability distribution of the members of the output sequences. These argument values for the continuous probability distribution function can be included in the compressed code or, included with a decoder.

Among the possibilities contemplated, the following is an example algorithm for determining a probability assignment for the elements of the spatial model using a probability distribution function and a hierarchical multi-resolution structured set. The method constructs and stores a lower resolution version of the space in computer memory, based on the number of units along the axis of the time and state dimensions. For example, 1 element of a lower resolution space may refer to 5 or 10 elements of a higher resolution space. The method then iterates through each member and checks the elements of the higher resolution space it corresponds to. For example, if a member corresponded to element (52, 35), x and y respectively, on a high resolution space, then the member would correspond to element 5 of the time dimension and 3 on the state dimension, (5,3) of the lower resolution space. A numerical strength value would be added to that square within the grid in computer memory each time a member of an output sequence corresponds to a lower resolution point, similarly to the process of adding a value of 1 to the correct element corresponding to a member of the output sequence, as described in the first embodiment. The more members that correspond with a point in the lower resolution space, the greater the probability value of the state represented by the elements in the related higher resolution space. When all the members of all the output sequences have been corresponded to the right elements, the result is a probability distribution as defined by the values of each square of the lower grid or space. When a gradient is generated by a function using the lower resolution space, a courser gradient results. Similar scalar values in the courser gradient may be normalized or averaged to create a smooth gradient in the higher resolution space. This example within this present embodiment is only one of many possible methods that may be utilized to generate a probability distribution gradient based on the correspondences of a member to an element, which, as may be appreciated by one skilled in the art, does not limit the scope of this inventive subject matter. It should be noted that the elements of the space can apply to a variety of applications, such as; pixels of an image, points of a metric space, voxels in a volumetric space, vectors of a vector space and so on.

Figure 16:
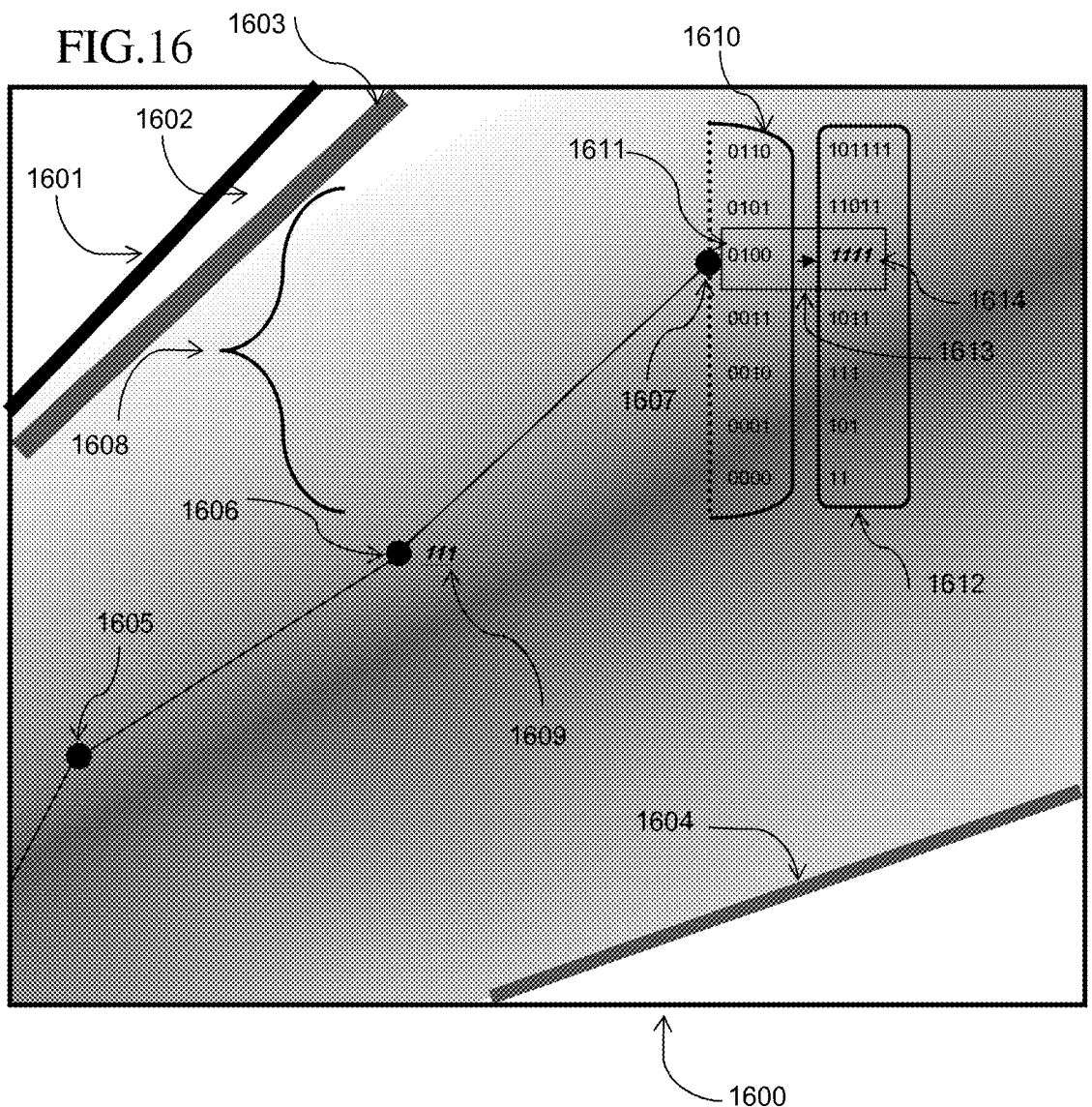
FIG. 16 is an exemplary diagram representing members of an output sequence being encoded using variable-length codes and a probability distribution gradient function, according to the present inventive subject matter.

FIG. 16 shows an exemplary diagram 1600 of an encoding process utilizing a variable-length code based on the probability values determined for the possible states represented by elements in space. A continuous probability distribution function creates a probability gradient for the positive probability subspace 1608, which is comprised by boundaries 1603 and 1604. The zero probability subspace 1602 is within boundaries 1601 and 1603. The probability field, which contains both the positive and zero probability subspaces, is comprised by the probability field boundary 1601. In this example, all elements of the positive probability subspace, which represent a possible state of a member, are assigned a probability value from the gradient output of the continuous probability distribution function. Members 1605, 1606 and 1607 correspond to elements of the set with added structure; therefore each probable state for the member corresponds to the probability value determined for the corresponding element. This probability value can then be used to generate a variable-length code represented by the ordered list of identifiers using techniques in the known art, such as Huffman and Arithmetic encoding, as seen in the diagram as code 1609 and 1614. FIG. 16 displays the correspondence 1613 between a probable state 1611 for member 1607 and a variable-length code 1614 within a set of variable-length codes 1612. Probable state 1611 and other probable states for member 1607 are considered to be comprised by its own state subset 1610. It is to note that the positive probability subspace 1608 represents the larger state subset of the data system, while the smaller state subset 1610 for member 1607 is comprised within the positive probability subspace. This example shows how the method, article comprising machine instructions, and apparatus may model a smaller state subset comprised by a larger state subset of a data system's state superset. In other words, the data processor may also determine the state subset for a unit of the data system, such as a member of an output sequence.

Out of the many possibilities contemplated, the method can pass an argument value to the continuous probability distribution function to obtain the probability value at a discrete point without constructing the set with added structure. For example, the method, article comprising machine instructions, and apparatus can pass the argument values of the time and state dimension (x,y) to the continuous probability distribution function, which then outputs the probability at that coordinate.

While a continuous probability distribution function may be used to assign probability values to each of the possible states represented by the elements of the space, among the possibilities contemplated, a discrete probability distribution function and probability mapping function may also be used for this purpose. The data processing device, by the data processor, may record the probability values determined for each possible state using a discrete probability distribution or a mapping function that uses a reference to assign the probability to the element discretely. A discrete probability distribution and probability map can be preferable if a probability distribution of the data system is determined to have a rather complex or ordered characteristic pattern that is difficult to approximate using a continuous gradient. To employ a discrete probability distribution function would be similar to the continuous version, except that instead of generating a smooth gradient by interpolation, the function would assign a probability to the elements discretely. To record a probability map, the method can analyze the number of members that correspond to each element of the space and determine a probability value by dividing the number of corresponding members at an element in the space by the total number of correspondences. For example, if there were 1000 output sequences, and an element corresponded to 500 members, a probability value of 0.5 would be assigned to that element and recorded for the probability map. This would be calculated for each element of the space when a probability map is used. When implementing the spatial statistical model for data processing, the method can access the probability map and assign the probability values to the elements, based on the argument values.

Figure 17:
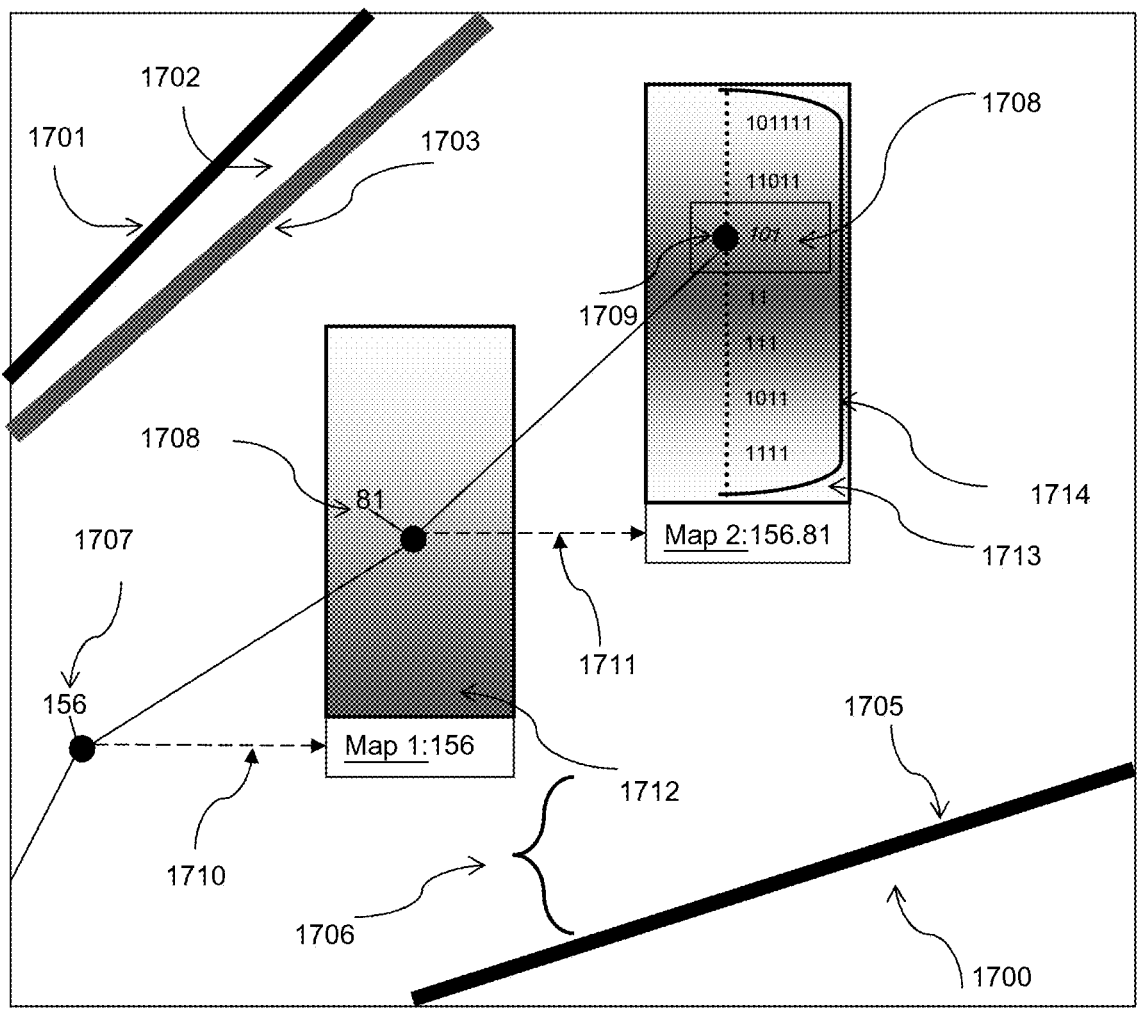
FIG. 17 is an exemplary diagram representing members of an output being encoded using variable-length codes and multiple probability distribution gradient functions, according to the present inventive subject matter.

Among the possibilities contemplated, the method can also allow the designation of multiple probability distribution functions or maps based on relationships between members. This results in a variable-length code based on multiple probability functions/maps, where the probability values for each element are based on a relationship between a currently evaluated member and a member that precedes the currently evaluated member in the output sequence. To accomplish this, the spatial statistical model is used to determine and record the probabilities based on the patterns of two are more members connected by a relationship, resulting in the generation of a probability distribution for all possible relationships between the members. FIG. 17 shows a graph of how this can be accomplished. The space 1700 and the boundary of the probability field 1701, contains positive probability space 1706 constrained by boundaries 1703 and 1705, with the zero probability subspace 1702 being comprised by probability field boundary 1701 and boundary 1703. A first member 1707 of an output sequence has a state value of "156", followed by second member 1708 with a state value of "81". In this case, the probability map 1712 attributed to the second member 1708 is dependent on the state of the preceding member 1707. These dependencies are shown in FIG. 17 as 1710 and 1711. Probability map 1712 is dependent on the state value of the first member 1707. Due to the fact that there are 256 possible states (0-255), there are 256 possible probability maps that may be assigned to elements corresponding to the second member 1708. In FIG. 17, probability map 1712 is labeled as "Map 1.156", which is to signify that it is the $156^{th}$ probability map in a map set assigned to the second member 1708. The second probability map 1713 is dependent on the state of the first and second member. This second mapping has a 65,536 possible probability maps that can be assigned to the elements corresponding to the third member 1709. A variable-length code is generated based on the probability value, as seen for the variable-length code 1708 that is assigned to the third member 1707. A set of variable-length codes 1714 is based on the probability values assigned to the elements by the probability map function 1713. One thing to note, probability map 1712 and 1713 each are a representation of a state subset comprising the possible states of members 1708 and 1709. While the states of the members as a whole sequence create a state, the individual members themselves also have their own state subsets, as seen in FIG. 17.

Out of the many possibilities contemplated, the method can also include more than one set with added structure, dimension or member to multiply the number of possible states that can be expressed, which may also be assigned probability distribution function or maps based on those relationships. The point of this particular example is to show what is possible to implement when the present method, article comprising machine instructions, and apparatus utilizes more than one probability distribution function or map for the space based on a variety of patterns, relationships and conditions used with variable-length coding.

Essentially, the variable-length code can depend on more than one probability distribution function, map or space. If there are more than one probability maps or functions associated with a state, the variable-length code will incorporate the probability values of the multiple probability functions/maps for the encoding of a member. The aspect of the present inventive material that should be clearly understood is the capability of using a function to generate and assign the probabilities values to the elements. Any process that determines a probability for the possible states of a systemic characteristic lies within the scope of the present inventive subject matter.

For the process of encoding/decoding, the first step is to generate the probability gradient that determines probability values for the possible states and implement the spatial statistical model. The second step is to utilize a variable-length encoding method which bases the code on said probability values. For decoding, the process reads the list of identifiers or variable-length code and references that code to the state or element of the space in the model using the same probability distribution function that generates the gradient in the space by passing the argument values of the model to the function, whereby the function outputs the probability of the state at that location in the probability field. The member of the output sequence is constructed by matching the code/identifier to the probability value, which is assigned to a particular element representing a state. When the match is complete, the correct state of the member is deciphered. An important aspect of the present inventive material is that these probabilities need not be described discreetly or adaptively. According to the present embodiment, once the probabilities are known from the output of the function or map, all that is needed is a method that refers the variable-length code to its respective value on the y axis or state dimension. The advantage to using this technique is that no enumeration calculation is required to encode/decode the output sequence. Another advantage is that the probable sequences can have variable probabilities, thus making possible a more efficient description of the probable states using the variable-length code.

Use Cases

Data Storage: Data storage involves data backup, recovery and archival. In most cases, data is stored on a secure tape medium for long term back up. The challenge involved with data storage is that the amount of data to archive securely, many times at a remote location, can be large. Compressing data usually results in data that has high or maximal information entropy, thus having random-like characteristics. Iterative encoding/decoding of compressed, high entropy data, as exemplified in the first, second and third example embodiments, can be used to increase the compression ratios, which can be a huge advantage for data archival. There would not be as much compressed data to a storage media such as tape using the iterative encoding method presented in this material. If a tree-data structure is used in the iterative encoding, it will allow certain files of the data to be recovered without decoding all the data. For example, a database would be compressed iteratively into a smaller file. A single tape would then be able to store a large amount of iteratively compressed data. If a particular file needed to be recovered, then the tape would be read and, using the iterative tree data structure technique presented in the second example embodiment, can recover only the desired file without needing to decode the entire set of files compressed. This allows for efficient data compression and encryption for the purpose of data storage.

Database machines/services: Database machines and services require dynamic access of files to and from a database device. They also require a large number of fast storage media to store and retrieve the data for clients connected to a network. The need for using a tree-data structure using the iterative encoding presented in this inventive material allows data over networks, such as websites, games, videos and applications, to be accessed without decoding all the data, resulting in a fast and efficient method for accessing files from a database machine. This is particularly important for multimedia services over the Internet, such as streaming video, audio and interactive media, video games or applications. For example, a client connects with the database and requests a file using internet protocols. The requested file is originally encoded using the techniques in this inventive material, particularly the iterative encoding technique using the spatial model for random-like data, which is usually the case for compressed data. At the client side, the encoded file is downloaded. The decoder may then decompress a single file or multiple files using the tree data structure for iterative decoding. Such a single file may be a photo from an interactive media file, such as a website or application; the entire set of files being the whole website or application. Another use of the present method, article comprising machine instructions, and apparatus using databases is for cloud computing services, where a client machine can download an application or use a hosted application over a network. The application can be encoded/decoded recursively, thereby facilitating a fast download of the software for the client and enabling the user to open the application. When the user closes the application, the client computer may compress the software and store for later use, thereby minimizing storage space on the client computer. Techniques in the known art that compress data can only encode data by a certain amount. Therefore, iterative data compression, as presented in this inventive material, can be of great benefit to databases when transferring files over the Internet, leading to databases requiring less storage media, less data being transmitted over a network and less power consumed.

Data Modeling and Analytics: Data modeling is used for a wide range of applications when an analysis is needed for a particular type of data, such as weather, stock prices, and human behavioral statistics. Data modeling assists with the planning and management of many different services that use data Implementing data systems with the spatial statistical model described in this inventive material to analyze systemic characteristics is a very powerful way to analyze data with complex relationships. Spatial statistical modeling can find shapes and probability field patterns for long sequences, which represents a data system's structure and other characteristics. The most and least probable data system can be deciphered using spaces of more than two dimensions. For example, statistics such as date of birth, height, and nationality can be discovered spatially using three state dimensions along a fourth interval dimension. Performing a spatial analysis of the data system's structure, which in the preceding example includes the relationships between the three variables, can help to reveal a structured pattern to a lengthy time series, which may not be available using other methods in the known art.

Computer Generated Data: Computer generated data can be used for visual effects in entertainment, medical imaging in health care, encryption in security, and physical simulations in various fields of science. Computer Generated data can require a considerable amount of processing and memory to generate. This is particularly true for constructing virtual polygons and voxels. Where compression can be useful is in the area of raytracing and polygonal collision. Raytracing is a technique that allows a processor to calculate light rays that reflect in a digital scene composed of polygons, which are typically triangles. For physical simulation such as fluids and hard/soft dynamics, the processor must calculate whether or not a polygon collides with other polygons in the scene at a given interval. The system must store and access extremely large amounts of data, which includes point locations of all the polygons and/or voxels to render/simulate the scene. The method of iterative encoding/decoding using the spatial statistical model to identify the state subset for random-like data can be used to compress the polygonal information in a scene, which can conserve memory. For example, the method would iteratively compress the polygonal data of the scene using a tree data structure that would be structured in a similar way to binary partitioning the scene, which allows a processor to find intersection hits between rays and polygons more efficiently. When a ray is fired into the scene, only the polygons that are near the ray would be decompressed, conserving memory and processing resources. This dynamic access to the scene using iterative compression can also allow a system to generate greater detail in the final rendering/simulation considering the memory limitations of a data processing device. Also, only the geometry or voxels seen by the camera can be decompressed, while other geometry hidden from view remains compressed.

An Information Generator may be created using the constraints of the spatial statistical model as guides for the generation of a data system. This is particularly useful for the generation of random-like data. For example, using the model as expressed in the preferred embodiments, a method may use said models to generate monotonic sequences that only exist within the positive probability subspace and that have a distribution as indicated by the probability space using said probability distribution functions or maps. The method can then generate a sequence using the spatial model as pseudo-random or random data and use such files for encryption to secure files.

Encryption: In addition to using the method, article comprising machine instructions, and apparatus to generate a random-like file for use as an encryption key for data security purposes, out of the many possibilities contemplated, the manner in which the sequence function reads the data system may also be used to encrypt the data. For example, the sequence function can read units of the data system in as many different read patterns that are possible given the size of the data system. By processing the members of the ordered sequence in a variety of sequence orders gives the method, article comprising machine instructions, and apparatus a way to encrypt the data further, as both the sequence function and the inverse of the sequence function are required to encode/decode the data. If the both the decoder knows which sequence function is used to process the data system and by which symbol set criteria, then the decoder can decode the ordered list of identifiers. Otherwise, the ordered list of identifiers will be undecipherable and the original data system unrecoverable. A file may be encrypted to an even greater degree by implementing iterative encoding, where each cycle can use a different reading pattern by a variety of sequence functions.

Media Transmission: Where a recursive encoding technique would be useful is for a video or audio file. Various sections of the file may be compressed in a tree data structure, where each node references a point in the recursion where a merging/appending of data systems occurs. Using this information, the decoder will decode only the blocks of data close to where the video or audio is currently being played. The tree can be arranged to facilitate the partitioning of video sections. As the file plays, sections of the stream that were played are recompressed, while the current and upcoming sections are decompressed as the pointer moves along the video/audio. This is accomplished by finding the shortest path in the tree between the child node signaled by a pointer (the current frame or section/clip being played) and the root of the tree, which is the final compressed file. The rest of the compressible data blocks outside the shortest path are not decoded. This helps reduce resources of a data processing device by only decompressing played parts of the video/audio stream.

Images: As a possible example that may be applied to the present method, article comprising machine instructions, and apparatus, a three dimensional space may be used to model a video or picture; a pixel system. Out of the possibilities contemplated, this may be modeled using a sphere, where its elements are also a three dimensional sphere that uses three state dimensions. The states of the pixel may be represented in the following way; a yawing angle/dimension, which contains all possible states for red, a pitch angle/dimension that contains all possible states for green, and a depth dimension, which extends from the center of the sphere element to its outer shell, which contains all the possible states for blue. Each unique state of the pixel is represented by an element of the sphere. A sequence of pixels and its possible states may then be summed using a monotonic sequence function, where a sequence of spheres is contained within the larger sphere space. The members of the path of the three dimensional sequence leads to a place and depth within the larger sphere space, comprising the smaller elemental spheres. An image or video with a unique systemic characteristic will have its monotonic path end at a unique location, as is the case for the two dimensional spaces described previously.

Media Acquisition: High definition video cameras are used extensively in film and television media. 3D video is also used in these related fields, which requires twice the data to store. Compression methods are needed for such media due to the large amounts of data usually acquired from such devices. Using the techniques presented in this inventive material, a video camera device would record the media. A data processor would read the incoming stream of bits as the recording commences, dividing the data into blocks for more efficient processing and compress said blocks. The resulting compressed data being information of high entropy, a specialized hardware implementation of the iterative data encoding method by a data processor may then take said blocks and recursively encode the data using the spatial statistical model for random-like characteristics. Because the data is primarily for storage, a tree data structure for the iterative encoding may not be required. This data may then be stored at the camera using a storage drive or remotely using fiber optic means and RAID storage.

Pattern Recognition: One of ordinary skill in the art may discern that the same aspects described in this inventive material to recognize random data can be applied for the recognition of ordered data, such as text, speech, imagery, movements and other observables. Indeed, the same processes presented in this inventive subject matter can be implemented to recognize any incoming signal. Patterns can be recognized within a space along the interval dimension (time), which may be any kind of pattern based on a variety of symbols; i.e., letters, shapes, sounds, etc; whereby the possible elements within a space are enclosed by probability constraints or boundaries. A match is made when the values of the features (members) are within a particular state subset, which is defined using probability constraints, probability distribution functions and probability maps, as explained in the previous example embodiments.

For example, the data processing system reads an incoming stream of phonemes (observable features). It then plots the sequence of phonemes as members of an output sequence that correspond to elements of a space, given particular symbol criteria, by applying the methods described in the first and second embodiments. A function may use "curve fitting" to specify a boundary defined by a continuous function, which bound the elements that correspond to members of the output sequence. A calculation test may be initiated using a library of other models stored in a storage medium to see whether or not the current boundary "fits," matches, or is enclosed within the constraints of another boundary model. One skilled in the art may use a straightforward approach for this test, such as an intersection test based on the elements of the space, described in the first example embodiment.

A match may also be made using techniques described in the third example embodiment, using probability distribution functions and probability mappings to model the probable states of data systems within the space. With regards to pattern recognition, the method can select states or sequences that correspond to elements associated with a higher probability than other elements. The method then generates the generated sequence where its members corresponds to the most likely state. For example, the data processor receives a sequence of phonemes. The data processor will receive, from a storage medium, the spatial model, which indicates the most probable sequence of letters based on the probability field established by the probability distribution and mapping functions. The data processor will then generate a sequence of letters that follows the most probable sequence of the spatial model.

Out of the possibilities contemplated, another possible embodiment for pattern recognition will use a multidimensional space. For example, the hue and brightness values of the pixels from an image may be structured using a trigonometric sequence function that processes the ordered sequence of pixels, whereby the output sequence coils to form a tubular shape, which was described as a possible embodiment of a sequence function in the first example. The values of hue and brightness distort the length of the radius for each member as the path is swept from the center of the circle. The result is a tubular pattern similar to indentations on a surface of a tube. These indentations may be used as a fingerprint for the data, which may be compared to other data systems and models. The algorithm for matching would use the same techniques described in the first example, particularly using a collision detection type algorithm, where the elements are treated as voxels. A match may be determined by the data processor based on how close or far the elements of the boundary are from the spatial model being compared. For example, if the boundary intersects too deep with or is spaced too from the spatial model, the processor can determine that a match may not be very probable.

The steps outlined for pattern recognition are not a limitation of the present inventive subject matter. Other steps may be employed using key aspects of the inventive material for the purposes of pattern recognition. This is merely an example of how the key aspects of the inventive subject matter may be employed for the purposes of pattern recognition.

It should be apparent to those skilled in the art that many more modifications besides those already described are possible without departing from the inventive concepts herein. The inventive subject matter, therefore, is not to be restricted except in the scope of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refers to at least one of something selected from the group consisting of A, B, C . . . and N, the text should be interpreted as requiring only one element from the group, not A plus N, or B plus N, etc.

What is claimed is:

1. A method of processing data, the method comprising:
   receiving, by a data processor comprising hardware, a data system comprising an aggregate of data units that manifest, as a whole, a state comprised by a state superset that comprises:
   different states of the data system, or
   different states of an aspect of the data system including at least one of one or more of a part, feature, structure, unit of data, data subsystem, or relationship between units or subsystems of the data system, or
   both different states of the data system and different states of the aspect of the data system,
   the data system corresponding to at least one of: an encoded message comprising symbols, a computer file comprising bytes, a compressed message comprising bits, a document comprising graphemes or alphanumeric symbols, a digital picture comprising pixels, a waveform file comprising samples, a video file comprising picture frames, or an executable comprising machine code symbols;
   determining, by the data processor, probabilities of a plurality of different states of the data system or a plurality of different states of the aspect of the data system comprised by the state superset based at least in part on a spatial statistical model comprising an element that represents the state comprised by the state superset;
   reducing, by the data processor, an amount of hardware memory needed to store a first message to be transmitted to a client device by constructing the first message with redundancy eliminated and with reduced average information entropy without loss, the first message comprising an ordered list of identifiers based, at least in part, on a probability of the state of the data system or a probability of a state of the aspect of the data system, the ordered list of identifiers representing at least one of the following:
   a boundary of a state subset, the state subset comprising a subset of states within the state superset, or the a state of the data system or the state of the aspect of the data system comprised by the state subset, or the state of the data system or the state of the aspect of the data system comprised by the state superset;

configuring, by the data processor, a decoder of the client device to generate a generated data system that corresponds to the state of the data system or the state of the aspect of the data system by transmitting the first message to the decoder, the first message constructed with elimination of redundancy and with reduced average information entropy without loss to reduce the amount of hardware memory needed to store the first message, the first message comprising the ordered list of identifiers to the decoder;

generating, by the decoder, the generated data system based, at least in part, on the first message comprising the ordered list of identifier.

2. The method of claim 1, further comprising determining, by the data processor, a number of possible states comprised by the state subset.

3. The method of claim 1, further comprising identifying, by the data processor, the state comprised by the state subset by employing a positional notation.

4. The method of claim 1, wherein determining the probabilities of the plurality of different states of the data system or the plurality of different states of the aspect of the data system, further comprises:

initiating, by the data processor, a sequence function that operates on an ordered sequence of data units from the data system to generate an output sequence that corresponds to the ordered sequence;

corresponding, by the data processor, the output sequence to the element that represents the state, in the plurality of different states of the data system or the plurality of different states of the aspect of the data system, the state comprised by the state superset to determine, by the data processor, an argument value that enables the decoder to determine the probability of the state of the data system or the state of the aspect of the data system by employing a function that performs at least one of:

determining, by the data processor, a number of times the state of the data system or the state of the aspect of the data system corresponds to the element;

determining, by the data processor, a number of times a member of the output sequence corresponds to the element;

determining, by the data processor, a probability of the state of the data system or the state of the aspect of the data system corresponding to the element;

determining, by the data processor, a range of probable outputs from the sequence function;

determining, by the data processor, a reference enabling an assignment of the probability of the state of the data system or the state of the aspect of the data system corresponding to the element;

selecting, by the data processor, the element as a constraint element representing the boundary of the state subset;

determining, by the data processor, a probability distribution indicating the probability of the state of the data system or the state of the aspect of the data system corresponding to the element; or determining, by the data processor, an indicator representing a type of state subset.

5. The method of claim 1, further comprising supercorresponding, by the data processor, at least two states of the state superset to a mutual element comprised by a space.

6. The method of claim 1, wherein the element corresponds to a location in space, wherein the space is selected from the group consisting of a Euclidean space, a Non-Euclidean space, a topological space and a phase space comprising at least one dimension.

7. The method of claim 1, further comprising constructing, by the data processor, a tree data structure comprising at least one of the following:

an index comprising a number of occurring transformation cycles, a node that represents an appending of at least two separate data systems as an appended data system in the transformation cycles.

8. The method of claim 1, further comprising iteratively applying, by the data processor, in a generation cycle: receiving an ordered list of identifiers and generating a generated data system based, at least in part, on the received ordered list of identifiers.

9. The method of claim 1, further comprising matching, by the data processor, a current state of the data system or the aspect of the data system to a corresponding state of the data system or the aspect of the data system comprised by the state superset to recognize the current state of the data system or the aspect of the data system as being similar to the corresponding state of the data system or the aspect of the data system.

10. The method of claim 1, wherein the state of the data system or the state of the aspect of the data system corresponds to a random-like state.

11. A system comprising:

a data store configured to store computer-executable instructions; and a hardware processor in communication with the data store, the hardware processor, configured to execute the computer-executable instructions to at least:

receive a data system comprising an aggregate of data units that manifest, as a whole, a state comprised by a state superset that comprises:

different states of the data system, or different states of an aspect of the data system including at least one of one or more of a part, feature, structure, unit of data, data subsystem, or relationship between units or subsystems of the data system, or both different states of the data system and different states of the aspect of the data system, the data system corresponding to at least one of: an encoded message comprising symbols, a computer file comprising bytes, a compressed message comprising bits, a document comprising graphemes or alphanumeric symbols, a digital picture comprising pixels, a waveform file comprising samples, a video file comprising picture frames, or an executable comprising machine code symbols;

determine probabilities of a plurality of different states of the data system or a plurality of different states of the aspect of the data system comprised by the state superset based at least in part on a spatial statistical model comprising an element that represents the state comprised by the state superset;

reduce an amount of hardware memory needed to store a first message to be transmitted to a destination device by constructing the first message with redundancy eliminated and with reduced average information entropy without loss, the first message comprising an ordered list of identifiers based, at least in part, on a probability of a state, in the different states, of the data system or a probability of the state of the aspect of the data system, the ordered list of identifiers representing at least one of the following:

a boundary of a state subset, the state subset comprising a subset of states within the state superset, or the state of the data system or the state of the aspect of the data system comprised by the state subset, or the state of the data system or the state of the aspect of the data system comprised by the state superset;

transmit the first message to the destination device, the first message constructed with elimination of redundancy and with reduced average information entropy without loss to reduce the amount of hardware memory needed to store the first message;

enable a decoder to generate a generated data system that corresponds to the state of the data system or the state of the aspect of the data system by providing the first message comprising the ordered list of identifiers to the decoder.

12. The system of claim 11, wherein the system is configured to determine a number of possible states comprised by the state subset.

13. The system of claim 11, wherein the system is configured to identify the state comprised by the state subset by employing a positional notation.

14. The system of claim 11, wherein the determination of the probabilities of the plurality of different states of the data system or the plurality of different states of the aspect of the data system, further comprises:

initiation of a sequence function that operates on an ordered sequence of data units from the data system to generate an output sequence that corresponds to the ordered sequence;

correspondence of the output sequence to the element that represents the state of the data system or the state of the aspect of the data system, comprised by the state superset to determine an argument value that enables the decoder to determine the probability of the state of the data system or the state of the aspect of the data system by employing a function that performs at least one:

determination of a number of times the state of the data system or the state of the aspect of the data system corresponds to the element;

determination of a number of times a member of the output sequence corresponds to the element;

determination of a probability of the state of the data system or the state of the aspect of the data system corresponding to the element;

determination of a range of probable outputs from the sequence function;

determination of a reference enabling an assignment of the probability of the state of the data system or the state of the aspect of the data system corresponding to the element;

selection of the element as a constraint element representing the boundary of the state subset;

determination of a probability distribution indicating the probability of the state of the data system or the state of the aspect of the data system; or corresponding to the element;

determination of an indicator representing a type of state subset.

15. The system of claim 11, wherein the system is configured to supercorrespond at least two states of the state superset to a mutual element comprised by a space.

16. The system of claim 11, wherein the element corresponds to a location in space, wherein the space is selected from the group consisting of a Euclidean space, a Non-Euclidean space, a topological space and a phase space comprising at least one dimension.

17. The system of claim 11, wherein the system is configured to construct a tree data structure comprising at least one of the following:

an index comprising a number of occurring transformation cycles, a node that represents an appending of at least two separate data systems as an appended data system in the transformation cycles.

18. The system of claim 11, wherein the system is configured to iteratively apply in a generation cycle: receiving an ordered list of identifiers and generating a generated data system based, at least in part, on the received ordered list of identifiers.

19. The system of claim 11, wherein the system is configured to match a current state of the data system or a current state of the aspect of the data system to a corresponding state of the data system or a corresponding state of the aspect of the data system comprised by the state superset to recognize the current state of the data system or the current state of the aspect of the data system as being similar to the corresponding state of the data system or the corresponding state of the aspect of the data system.

20. The system of claim 11, wherein the state of the data system or the state of the aspect of the data system corresponds to a random-like state.

21. A method of processing data, the method comprising:

receiving, by a data processor comprising hardware, a data system comprising an aggregate of data units that manifest, as a whole, a state comprised by a state superset that comprises:

different states of the data system, or different states of an aspect of the data system including at least one of one or more of a part, feature, structure, unit of data, data subsystem, or relationship between units or subsystems of the data system, or both different states of the data system and different states of the aspect of the data system, the data system corresponding to at least one of: an encoded message comprising symbols, a compressed message comprising bits, a computer file comprising bytes, a document comprising graphemes or alphanumeric symbols, a digital picture comprising pixels, a waveform file comprising samples, a video file comprising picture frames, or an executable comprising machine code symbols;

determining, by the data processor, probabilities of a plurality of different states of the data system or a plurality of different states of the aspect of the data system comprised by the state superset based at least in part on a spatial statistical model comprising an element that represents the state comprised by the state superset;

reducing, by the data processor, an amount of hardware memory needed to store a first message to be transmitted to a destination device by constructing the first message by reducing redundancy and with reduced average information entropy without loss, the first message comprising an ordered list of identifiers based, at least in part, on a probability of the state of the data system or a probability of the state of the aspect of the data system, the ordered list of identifiers representing at least one of the following:

a boundary of a state subset, the state subset comprising a subset of states within the state superset, or the state of the data system or the state of the aspect of the data system comprised by the state subset, or
the state of the data system or the state of the aspect of the data system comprised by the state superset;
transmitting the first message to the destination device, the first message constructed with elimination of redundancy and with reduced average information entropy without loss to reduce the amount of hardware memory needed to store the first message;
enabling, by the data processor, a decoder to generate a generated data system that corresponds to the state of the data system or the state of the aspect of the data system by providing the first message comprising the ordered list of identifiers to the decoder.

22. The method of claim 21, further comprising determining, by the data processor, a number of possible states comprised by the state subset.

23. The method of claim 21, further comprising identifying, by the data, processor, the state comprised by the state subset by employing a positional notation.

24. The method of claim 21, wherein determining the probabilities of the plurality of different states of the data system or the plurality of different states of the aspect of the data system, further comprises:
initiating, by the data processor, a sequence function that operates on an ordered sequence of data units from the data system to generate an output sequence that corresponds to the ordered sequence;
corresponding, by the data processor, the output sequence to the element that represents the state, in the plurality of different states of the data system or the plurality of different states of the aspect of the data system, the state comprised by the state superset to determine, by the data processor, an argument value that enables the decoder to determine the probability of the state of the data system or the state of the aspect of the data system by employing a function that performs at least one of:
determining, by the data processor, a number of times the state of the data system or the state of the aspect of the data system corresponds to the element;
determining, by the data processor, a number of times a member of the output sequence corresponds to the element;
determining, by the data processor, a probability of the state of the data system or the state of the aspect of the data system corresponding to the element;
determining, by the data processor, a range of probable outputs from the sequence function;
determining, by the data processor, a reference enabling an assignment of the probability of the state of the data system or the state of the aspect of the data system corresponding to the element;
selecting, by the data processor, the element as a constraint element representing the boundary of the state subset;
determining, by the data processor, a probability distribution indicating the probability of the state of the data system or the state of the aspect of the data system corresponding to the element; or
determining, by the data processor, an indicator representing a type of state subset.

25. The method of claim 21, further comprising super-corresponding, by the data processor, at least two states of the state superset to a mutual element comprised by a space.

26. The method of claim 21, wherein the element corresponds to a location in space, wherein the space is selected from the group consisting of a Euclidean space, a Non-Euclidean space, a topological space and a phase space comprising at least one dimension.

27. The method of claim 21, further comprising constructing, by the data processor, a tree data structure comprising at least one of the following:
an index comprising a number of occurring transformation cycles,
a node that represents an appending of at least two separate data systems as an appended data system in the transformation cycles.

28. The method of claim 21, further comprising matching, by the data processor, a current state of the data system or the aspect of the data system to a corresponding state of the data system or the aspect of the data system comprised by the state superset to recognize the current state of the data system or the aspect of the data system as being similar to the corresponding state of the data system or the aspect of the data system.

29. The method of claim 21, wherein the state of the data system or the state of the aspect of the data system corresponds to a random-like state.

30. A non-transitory computer-readable storage medium storing computer-executable instructions that when executed by a processor perform operations comprising:
receiving a data system comprising an aggregate of data units that manifest, as a whole, a state comprised by a state superset that comprises:
different states of the data system, or
different states of an aspect of the data system including at least one of one or more of a part, feature, structure, unit of data, data subsystem, or relationship between units or subsystems of the data system, or
both different states of the data system and different states of the aspect of the data system,
the data system corresponding to at least one of: an encoded message comprising symbols, a computer file comprising bytes, a compressed message comprising bits, a document comprising graphemes or alphanumeric symbols, a digital picture comprising pixels, a waveform file comprising samples, a video file comprising picture frames, or an executable comprising machine code symbols;
determining probabilities of a plurality of different states of the data system or a plurality of different states of the aspect of the data system comprised by the state superset based at least in part on a spatial statistical model comprising an element that represents the state comprised by the state superset;
reducing an amount of hardware memory needed to store a first message to be transmitted to a destination device by constructing the first message with reduced redundancy and with reduced average information entropy without loss, the first message comprising an ordered list of identifiers based, at least in part, on a probability of a state of the data system or a probability of the state of the aspect of the data system, the ordered list of identifiers representing at least one of the following:
a boundary of a state subset, the state subset comprising a subset of states within the state superset, or
the state of the data system or the state of the aspect of the data system comprised by the state subset, or
the state of the data system or the state of the aspect of the data system comprised by the state superset;
transmitting the first message to the destination device, the first message constructed with reduced redundancy and with reduced average information entropy without loss to reduce the amount of hardware memory needed to store the first message;

enabling a decoder to generate a generated data system that corresponds to the state of the data system or the state of the aspect of the data system characteristic by providing the first message comprising the ordered list of identifiers to the decoder.

* * * * *

UNITED STATES PATENT AND TRADEMARK OFFICE
CERTIFICATE OF CORRECTION

PATENT NO. : 9,805,310 B2
APPLICATION NO. : 14/381940
DATED : October 31, 2017
INVENTOR(S) : Adam Jeffries It is certified that error appears in the above-identified patent and that said Letters Patent is hereby corrected as shown below:

In the Specification

In Column 18 at Line 20, Change "spinning" to --spinning.--.

In Column 26 at Line 60, Change " $|U_{i=1}^n A_1| = \Sigma_{k=1}^n (-1)^{k+1} (\Sigma_{1 \leq i_1 < \ldots < i_k \leq n} |A_{i_1} \cap \ldots \cap A_{i_k}|)$ " to -- $|U_{i=1}^n A_1| = \sum_{k=1}^n (-1)^{k+1} (\sum_{1 \leq i_1 < \cdots < i_k \leq n} |A_{i_1} \cap \ldots \cap A_{i_k}|)$ --.

In Column 27 at Line 61, Change "3.402822×1038." to --3.402822×10$^{38}$.--.

In Column 31 at Line 24, Change "an a" to --a--.

In Column 31 at Line 29, Change "the a" to --a--.

In Column 32 at Line 39, Change " $\Sigma_{min(y,Q_{q+1})x=0} F(y-x,q).$ " to -- $\sum min(y,Q_{q+1})x=0 F(y-x,q).$ --.

In Column 32 at Line 47, Change "max(a+1, lowconstraint_b)" to --max(a+1,lowconstraint_b)--.

In Column 32 at Line 49, Change "max(c+1,lowconstraintd)" to --max(c+1,lowconstraint_d)--.

In Column 35 at Line 49, Change "type)" to --type).--.

In Column 39 at Line 34, Change "files" to --files.--.

In Column 46 at Line 49, Change "data" to --data.--.

Signed and Sealed this
Eighth Day of May, 2018

Andrei Iancu
*Director of the United States Patent and Trademark Office*

CERTIFICATE OF CORRECTION (continued)
U.S. Pat. No. 9,805,310 B2

In the Claims

In Column 50 at Line 63, In Claim 1, change "the a" to --the--.